(12) United States Patent
Van Der Post et al.

(10) Patent No.: US 10,248,029 B2
(45) Date of Patent: Apr. 2, 2019

(54) METHOD AND APPARATUS FOR INSPECTION AND METROLOGY

(71) Applicant: ASML Netherlands B.V., Veldhoven (NL)

(72) Inventors: Sietse Thijmen Van Der Post, Utrecht (NL); Ferry Zijp, Nuenen (NL); Sander Bas Roobol, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/580,500

(22) PCT Filed: Jul. 5, 2016

(86) PCT No.: PCT/EP2016/065786
§ 371 (c)(1),
(2) Date: Dec. 7, 2017

(87) PCT Pub. No.: WO2017/012857
PCT Pub. Date: Jan. 26, 2017

(65) Prior Publication Data
US 2018/0188658 A1 Jul. 5, 2018

(51) Int. Cl.
*G03B 27/54* (2006.01)
*G03F 7/20* (2006.01)

(52) U.S. Cl.
CPC .......... *G03F 7/705* (2013.01); *G03F 7/7085* (2013.01); *G03F 7/70625* (2013.01); *G03F 7/70633* (2013.01)

(58) Field of Classification Search
CPC ....... G01B 5/28; G03F 9/7046; G03F 9/7092;
G03F 9/7096; G03F 7/70625; G03F 7/70633; G03F 7/70641; G03F 7/70666; G03F 7/70675; G03F 7/70683; G03F 7/705; G03F 7/7085
USPC ......... 355/30, 52, 53, 55, 67–71, 72, 75, 77; 250/492.1, 492.2, 492.22; 702/40, 94, 95, 702/150, 155, 166, 189; 356/496, 503, 356/504, 511–516, 600, 237.7, 237.2, 356/399–401, 505, 508–509
See application file for complete search history.

(56) References Cited

U.S. PATENT DOCUMENTS

| | | |
|---|---|---|
| 6,934,024 B2 | 8/2005 | Zhan et al. |
| 7,791,732 B2 | 9/2010 | Den Boef et al. |
| 8,233,155 B2 | 7/2012 | Kiers et al. |
| 8,411,287 B2 | 4/2013 | Smilde et al. |

(Continued)

OTHER PUBLICATIONS

International Search Report and Written Opinion dated Nov. 24, 2016 in corresponding International Patent Application No. PCT/EP2016/065786.

(Continued)

*Primary Examiner* — Christina A Riddle
(74) *Attorney, Agent, or Firm* — Pillsbury Winthrop Shaw Pittman LLP

(57) ABSTRACT

A method involving a radiation intensity distribution for a target measured using an optical component at a gap from the target, the method including: determining a value of a parameter of interest using the measured radiation intensity distribution and a mathematical model describing the target, the model including an effective medium approximation for roughness of a surface of the optical component or a part thereof.

20 Claims, 13 Drawing Sheets

(56) References Cited

U.S. PATENT DOCUMENTS

| | | | |
|---|---|---|---|
| 9,081,303 B2 | 7/2015 | Cramer et al. | |
| 2003/0227623 A1* | 12/2003 | Zhan | G01J 4/00 356/369 |
| 2006/0050283 A1* | 3/2006 | Hill | G03F 7/70625 356/512 |
| 2006/0066855 A1 | 3/2006 | Boef et al. | |
| 2006/0132749 A1* | 6/2006 | Bruls | G03F 7/70433 355/69 |
| 2008/0088854 A1 | 4/2008 | Kiers et al. | |
| 2011/0027704 A1* | 2/2011 | Cramer | G03F 7/70641 430/30 |
| 2011/0043791 A1 | 2/2011 | Smilde et al. | |
| 2012/0044470 A1 | 2/2012 | Smilde et al. | |
| 2013/0342831 A1* | 12/2013 | Levinski | G03F 7/70633 356/237.1 |

OTHER PUBLICATIONS

Vamivakas, A. Nickolas et al.,"A case study for optics: The solid immersion microscope", American Journal of Physics, vol. 76, No. 8, pp. 758-768 (2008).

Petrik, P. et al., "Methods for optical modeling and cross-checking in ellipsometry and scatterometry", Proceedings of SPIE, vol. 9526, pp. 95260S-1-95260S-11 (Jun. 2015).

Gross, H. et al., "Modeling of line roughness and its impact on the diffraction intensities and the reconstructed critical dimensions in scatterometry", Applied Optics, vol. 51, No. 30, pp. 7384-7394 (2012).

Rodriguez, Alejandro W. et al., "The Casimir effect in microstructured geometries", Nature Photonics, vol. 5, No. 4, pp. 211-221 (2011).

* cited by examiner

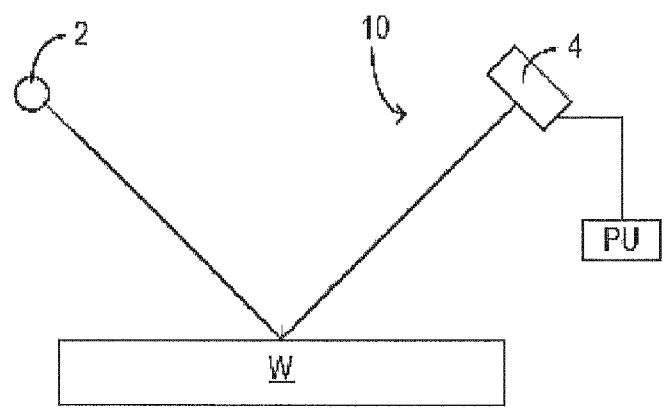
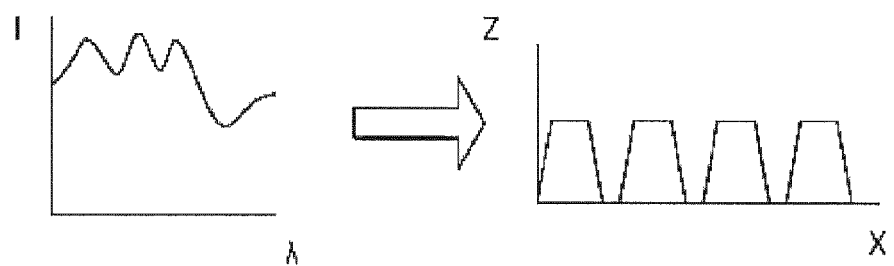
Fig. 3

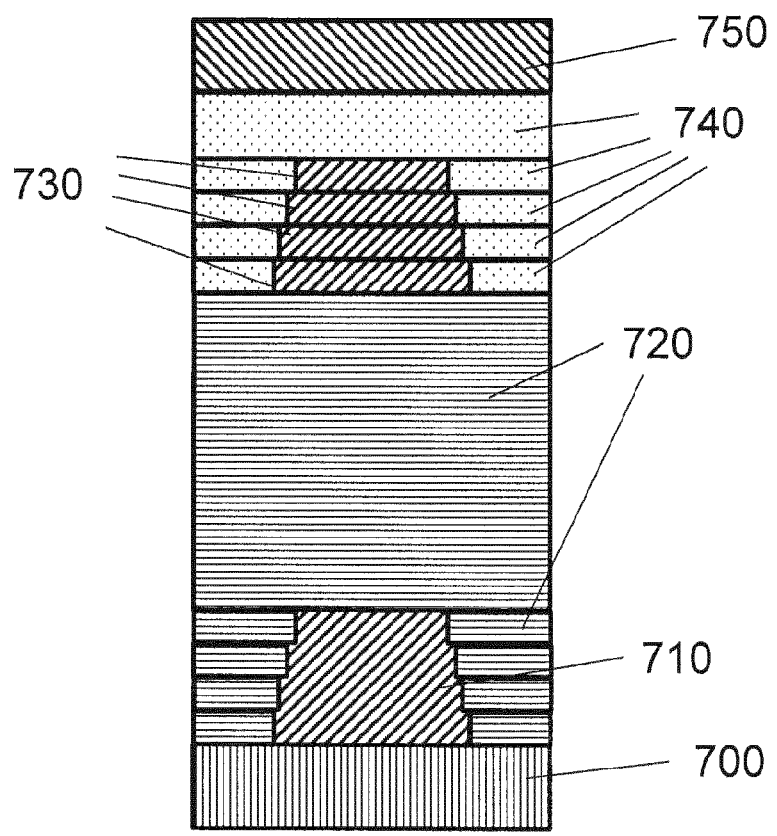
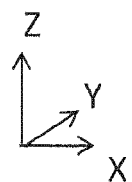
Fig. 7

METHOD AND APPARATUS FOR INSPECTION AND METROLOGY

CROSS-REFERENCE TO RELATED APPLICATIONS

This application is the U.S. national phase entry of PCT patent application no. PCT/EP2016/065786, which was filed on Jul. 5, 2016, which claims the benefit of priority of U.S. provisional patent application No. 62/194,042, which was filed on Jul. 17, 2015, and which is incorporated herein in its entirety by reference.

FIELD

The present description relates to a method and apparatus for correction of error in measured radiation distribution captured from a metrology target.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor one or more steps of the lithographic process (i.e., a process of device manufacturing involving lithography, including, e.g., resist-processing, etching, development, baking, etc.), the patterned substrate is inspected and one or more parameters of the patterned substrate are measured. The one or more parameters may include, for example, the overlay error between successive layers formed in or on the patterned substrate and/or critical linewidth of developed photosensitive resist. This measurement may be performed on a target of the product substrate itself and/or on a dedicated metrology target provided on the substrate. There are various techniques for making measurements of the microscopic structures formed in lithographic processes, including the use of a scanning electron microscope and/or various specialized tools.

A fast and non-invasive form of specialized inspection tool is a scatterometer in which a beam of radiation is directed onto a target on a substrate and properties of the scattered or reflected beam are measured. By comparing one or more properties of the beam before and after it has been reflected or scattered from the substrate, one or more properties of the substrate can be determined. Two main types of scatterometer are known. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity of the scattered radiation as a function of angle.

A particular application of scatterometry is in the measurement of feature asymmetry within a periodic target. This can be used as a measure of overlay error, for example, but other applications are also known. In an angle resolved scatterometer, asymmetry can be measured by comparing opposite parts of the diffraction spectrum (for example, comparing the −1st and +1$^{st}$ orders in the diffraction spectrum of a periodic grating). This can be done simply in angle-resolved scatterometry, as is described for example in U.S. patent application publication US2006-066855.

SUMMARY

With reduction of the physical dimensions in lithographic processing, there is demand to, for example, increase measurement accuracy/precision and/or reduce the space occupied by targets dedicated to metrology. Image based scatterometry measurements have been devised to allow the use of smaller targets, by taking separate images of the target using −1$^{st}$ and +1$^{st}$ order radiation in turn. Examples of this image based technique are described in published U.S. patent application publication nos. US2011-0027704, US2011-0043791 and US2012-0044470, which are incorporated herein in their entirety by reference.

Demand for further reduction in target size and for improved accuracy or precision continues, however, and existing techniques suffer from various constraints that make it difficult to maintain accuracy and/or reduce the size of the targets. Another way to improve on inspection and measurement techniques is to use a solid immersion lens (SIL) as the optical element nearest the target surface (e.g., a substrate). The extreme proximity of the SIL with the target surface (e.g., substrate) results in a very high effective numerical aperture (NA) larger than 1. Using an incoherent or coherent radiation source with this SIL allows a very small target to be inspected.

To take advantage of the increasing numerical aperture, the gap between the SIL and the substrate should be set to a desired value. For example, the gap may be within the range of 10-50 nm to have the SIL in effective optical contact with the substrate. An example optical gap measuring method and apparatus can involve detecting cross components of polarization in the high numerical aperture element. The cross polarized signal is then recorded by a detector and can be used as an input parameter into a gap control process. In another example, the gap may be controlled by reference to reflected laser radiation intensity. As will be appreciated, other methods and apparatus may be used to arrive at a signal representative of the gap (e.g., representative of its size or of its variation from a nominal size).

Irrespective of detecting method, the gap between the SIL (or other component) and the substrate (or other surface) should be established, and maintained at, a desired gap distance or distance range, typically by an associated actuator and control system. This is because the measurement data (e.g., intensity data, image, etc.) derived from the radiation redirected by the target, and obtained using the SIL (or other optical coupling component), depends on the gap, and any parameter of interest (e.g., height of a part of the target pattern, width of a part of the target pattern, thickness of one or more various layers of the target pattern, etc.) as well as the gap distance itself will be reconstructed from the measured data assuming an essentially constant gap distance during data acquisition.

But, regardless of the control mechanism used to establish, and maintain, the desired gap, it has been discovered that a variation in the surface of the SIL tip from an expected perfectly flat or curved surface thereof (hereinafter roughness) can yield errors in measurement results. And, it has been discovered that even a small roughness of the SIL tip may cause unacceptably large error in the determination of one or more parameters of interest derived from the measurement data. Accordingly, it is desired to provide, for example, one or more methods and apparatus to correct measurements and/or calculations using data obtained using a SIL (or other component) for a roughness of the SIL tip.

In an embodiment, there is provided a method involving a radiation intensity distribution for a target measured using an optical component at a gap from the target, the method comprising: determining a value of a parameter of interest using the measured radiation intensity distribution and a mathematical model describing the target, the model comprising an effective medium approximation for roughness of a surface of the optical component or a part thereof.

In an embodiment, there is provided a method involving a mathematical model describing a measurement target, the model comprising an effective medium approximation for roughness of a surface of an optical element used to measure the target, the method comprising: illuminating, using the optical element, a surface of a fiducial with radiation; measuring the radiation using a detector; and using the measured radiation, determining one or more parameters of the effective medium approximation in the model.

In an embodiment, there is provided a method involving a radiation intensity distribution measured using an optical component at a gap from a surface, the method comprising: determining a roughness parameter of the optical component, a fiducial or a target using the measured radiation intensity distribution and a mathematical model describing the surface, the model comprising an effective medium approximation for roughness of a surface of an optical component or a part thereof.

BRIEF DESCRIPTION OF THE DRAWINGS

Embodiments will now be described, by way of example only, with reference to the accompanying drawings in which:

FIG. 3 schematically depicts an example inspection apparatus and metrology technique;

FIG. 7 schematically depicts an example unit cell model of a feature of a periodic structure of a target;

DETAILED DESCRIPTION

Before describing embodiments in detail, it is instructive to present an example environment in which embodiments may be implemented.

Figure 1:
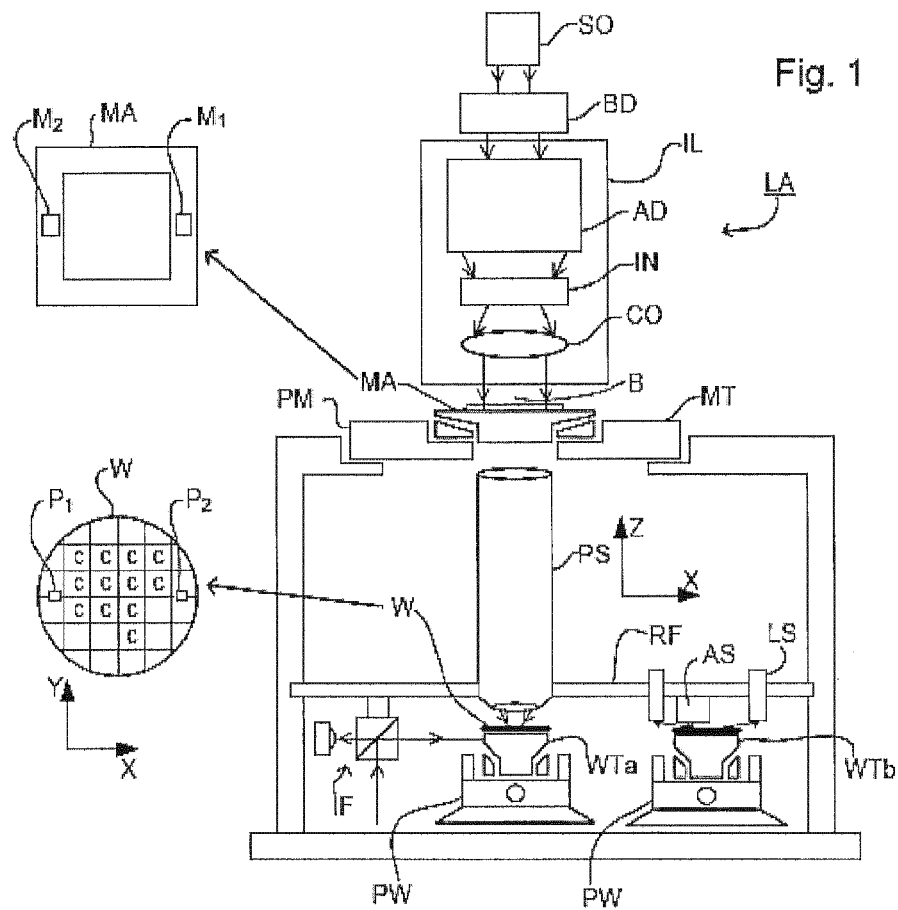
FIG. 1 schematically depicts an embodiment of a lithographic apparatus.

FIG. 1 schematically depicts a lithographic apparatus LA. The apparatus comprises:
  an illumination system (illuminator) IL configured to condition a radiation beam B (e.g. UV radiation, DUV radiation or EUV radiation).
  a support structure (e.g. a mask table) MT constructed to support a patterning device (e.g. a mask) MA and connected to a first positioner PM configured to accurately position the patterning device in accordance with certain parameters;
  a substrate table (e.g. a wafer table) WT constructed to hold a substrate (e.g. a resist-coated wafer) W and connected to a second positioner PW configured to accurately position the substrate in accordance with certain parameters; and
  a projection system (e.g. a refractive projection lens system) PL configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
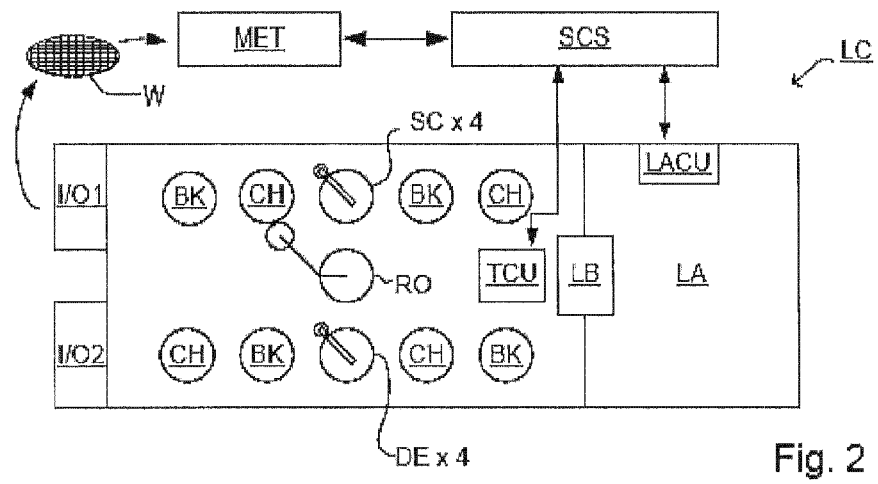
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

FIG. 3 depicts an example inspection apparatus (e.g., a scatterometer). It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some parameters are assumed from knowledge of the process by which the structure was made, leaving only a few parameters of the structure to be determined from the measured data. Such an inspection apparatus may be configured as a normal-incidence inspection apparatus or an oblique-incidence inspection apparatus.

Figures 4, 5:
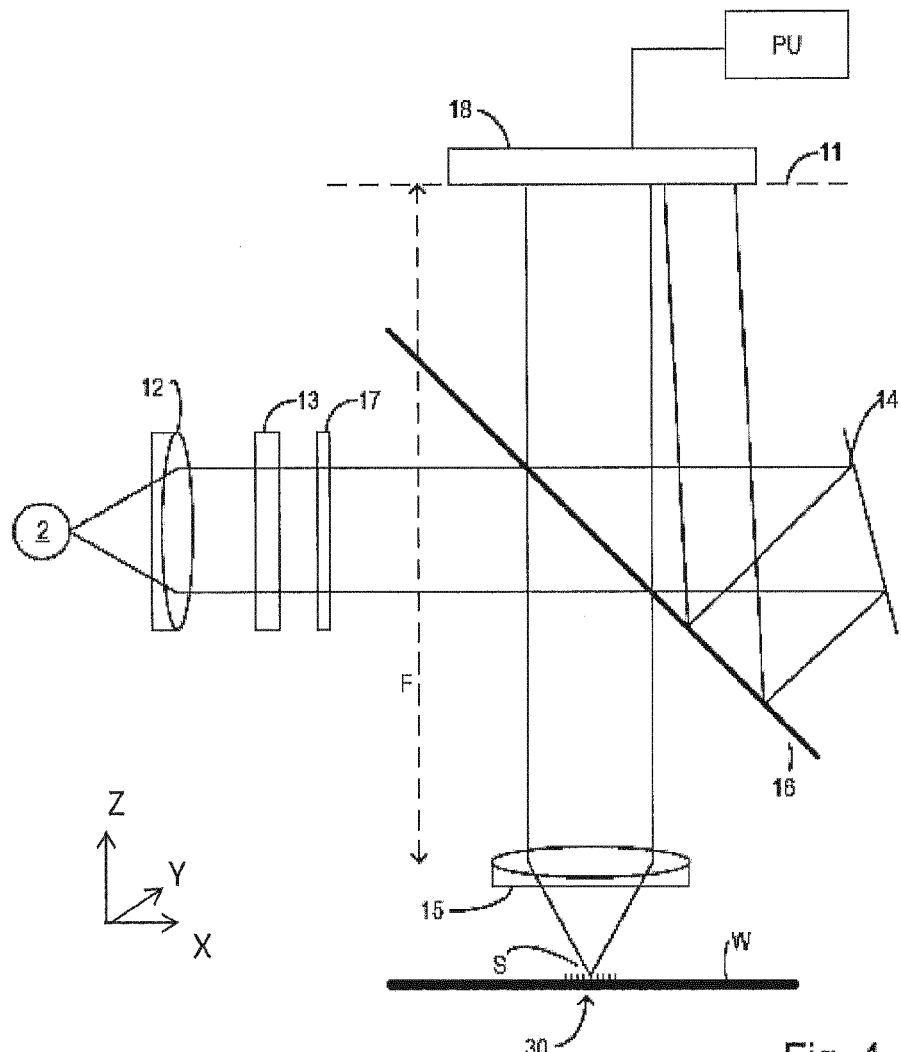
FIG. 4 schematically depicts an example inspection apparatus.
FIG. 5 illustrates the relationship between an illumination spot of an inspection apparatus and a metrology target.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate tables WTa, WTb of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 is available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to optical aberration in the lithographic projection apparatus, particularly the projection system PS, and illumination symmetry and the presence of such aberration will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
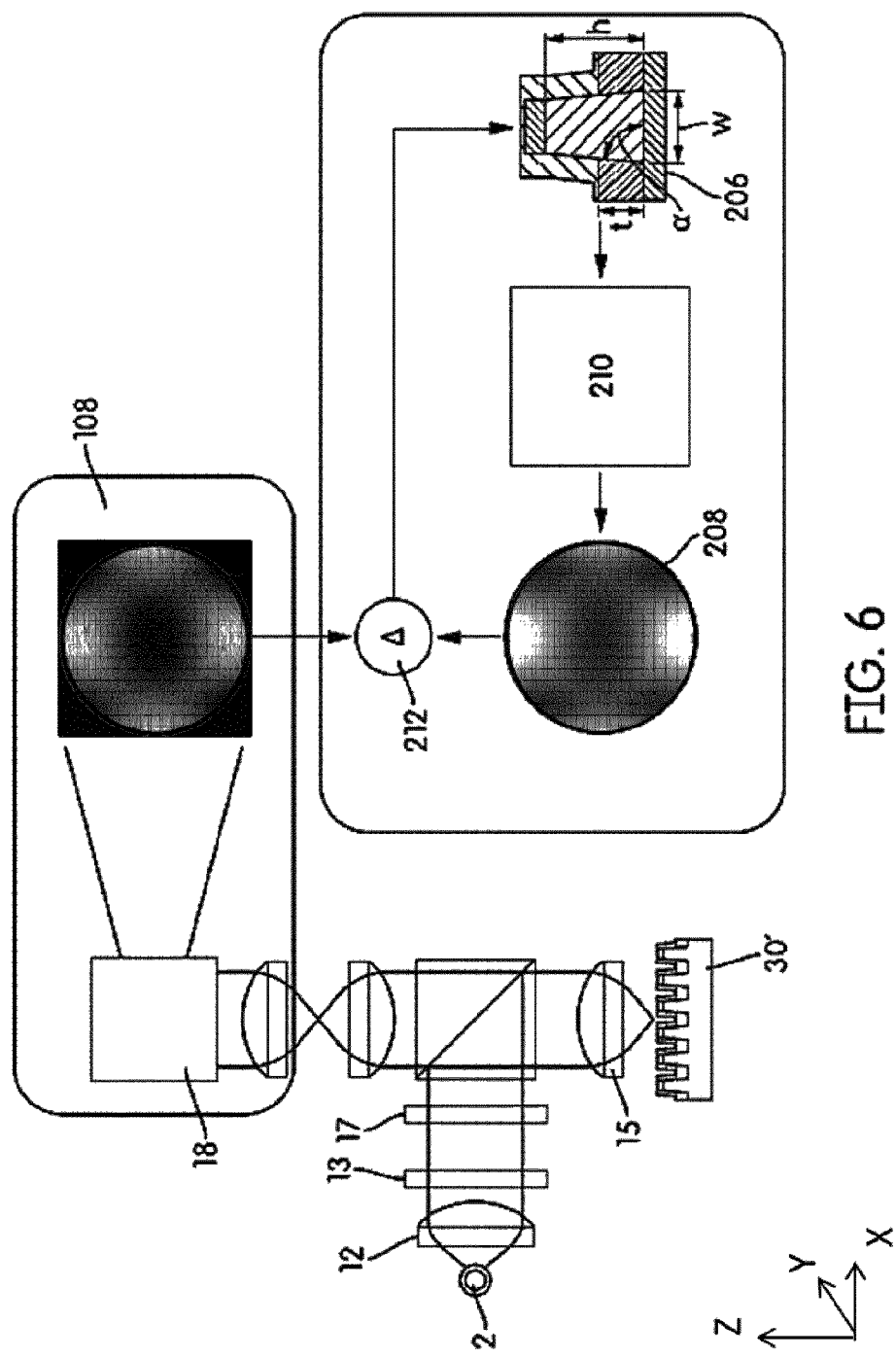
FIG. 6 schematically depicts a process of deriving a parameter of interest based on measurement data.

FIG. 6 schematically depicts an example process of the determination of one or more parameters of interest of a target pattern based on measurement data obtained using metrology. Radiation detected by detector 18 provides a measured radiation distribution 108 for target 30'. This measured radiation distribution 108 contains information to enable derivation of a parameter of interest such as the overlay error between successive layers formed in or on the substrate and/or critical dimension of, e.g., developed photosensitive resist. FIG. 7 depicts an example unit cell model of a portion of a target (such as target 30, 30') and example layers of various materials making up, and associated with, the target. For example, the target may comprise a layer of silicon nitride ($Si_3N_4$) represented by segment 710, which layer may form a grating feature, overlying, e.g., a bare silicon substrate or other layer represented by segment 700. Overlying layer 710 may be a layer of TEOS (tetraethyl orthosilicate) represented by segment 720. Overlying layer 720 is a further layer of silicon nitride ($Si_3N_4$) represented by one or more segments 730, which may form a further grating feature (e.g., a grating feature for measuring overlay). Overlying layer 730 is a vacuum or non-solid medium gap represented by one or segments 740, such as gas (e.g., air). And, further overlying layer 730 is an optical element, represented by segment 750, from which radiation emanates, through the vacuum/medium 740, toward the layer 730. In FIG. 7, the layer 730 and vacuum/medium 740 are shown segmented in to a plurality of segments to facilitate calculation, while in reality the layer 730 and/or vacuum/medium 740 is typically continuous. Similarly, layers 750, 720, 710 and 700 are represented by a single segment, but may be represented by a plurality of segments.

For a given target 30', a radiation distribution 208 can be computed/simulated from a parameterized model 206 (such as the unit cell of FIG. 7) of the pattern for target 30' using, for example, a numerical Maxwell solver 210. The parameterized model 206 may include one or more of the parameters of the segments identified in FIG. 7, such as the thickness of one or more layers, the refractive index (e.g., a real or complex refractive index, refractive index tensor, etc.) of one or more of the layers, a sidewall angle of one or more layers, absorption of one or more layers, etc., as well as of any portions thereof (such as one or more portions or combinations of portions) such as the segments identified for the layer 730 and vacuum/medium 740. The initial values of the parameters may be those expected for the target being measured. The measured radiation distribution 108 is then compared at 212 to the computed radiation distribution 208 to determine the difference between the two. If there is a difference, the values of one or more of the parameters of the parameterized model 206 may be varied, a new computed radiation distribution 208 calculated and compared against the measured radiation distribution 108 until there is sufficient match between the measured radiation distribution 108 and the computed radiation distribution 208. At that point, the values of the parameters of the parameterized model 206 provide a good or best match of the geometry of the actual target 30'. One of those parameters of the parameterized model (e.g., CD) may be used by the user for evaluating one or more steps of the lithographic process or other manufacturing process. Additionally or alternatively, a parameter of interest may be derived from one or more of the values of the parameterized model.

But, there is demand to reduce the space occupied by metrology targets.

For example, there is a desire to reduce the width of 'scribe lanes' between target portions C on the substrate, where metrology targets have conventionally been located. Additionally or alternatively, there is a desire, for example, to include metrology targets within the device patterns themselves, to allow more accurate and/or precise monitoring and correction of variations in parameters such as CD and/or overlay. To this end, alternative methods of diffraction based metrology have been devised more recently. For example, in image-based metrology, two images of the target are made, each using different selected orders of the diffraction spectrum. Comparing the two images, one can obtain asymmetry information. By selecting parts of the images, one can separate the target signal from its surroundings. The targets can be made smaller, and need not be square, so that several can be included within the same illumination spot. Examples of this technique are described in U.S. patent application publications US2011-0027704, US2011-0043791, and US2012-0044470.

In addition to or alternatively to reducing the space occupied by metrology targets, there is demand to improve the nature of the measurements themselves, such as their accuracy and/or precision. For example, there is a desire to, for example, obtain higher sensitivity of measurement. Additionally or alternatively, there is a desire to, for example, obtain better decoupling between various parameters in the reconstruction described above. For example, it is desired to obtain better values for each of the specific parameters of interest, by reducing or eliminating the effect of measurements associated with one parameter of interest influencing another parameter of interest.

As the demand for size reduction and/or accuracy continues, existing techniques may meet some technical limitations. For example, some methods desire to capture at least the $\pm 1^{st}$ diffraction orders. Taking into account the numerical aperture of the objective 15, this constrains the pitch (L) of a periodic structure of the target. To improve sensitivity and/or to reduce target size, one can consider using shorter wavelengths λ. Further, the target cannot be too small otherwise it will not have enough features to be considered as a periodic structure. Consequently, overlay, as an example, is measured using periodic structures features (e.g., lines) having dimensions far bigger than those of the product (e.g., device) layout, making overlay measurement less reliable. Ideally the feature line and pitch should have similar dimensions to the product features.

Figure 8:
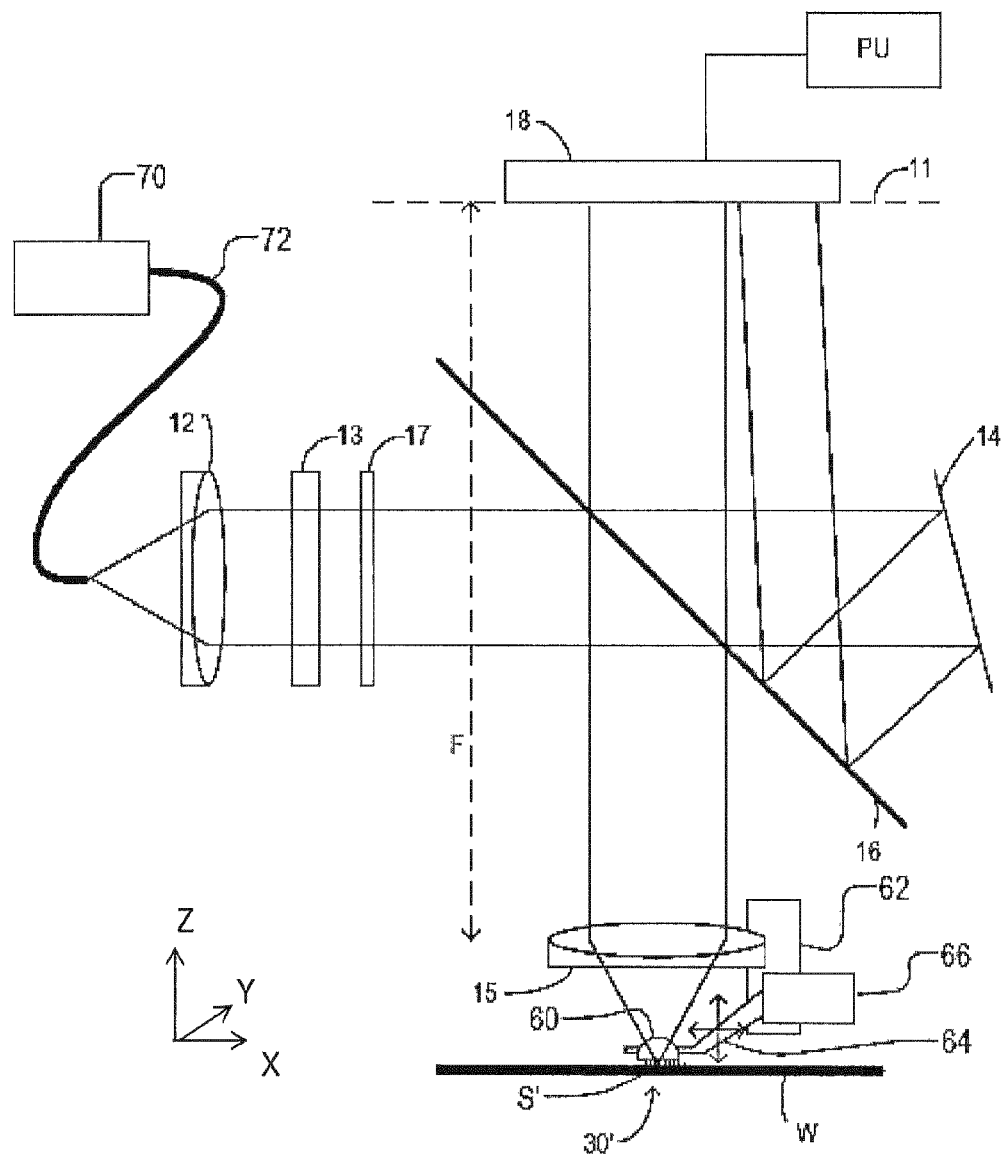
FIG. 8 depicts an example inspection apparatus comprising a solid immersion lens (SIL)

FIG. 8 shows an inspection apparatus in which improvement of the nature of the measurements themselves (e.g., accuracy and/or precision) and/or reduction of target size may be realized. In FIG. 8, a spot S' (which may be smaller than convention if, for example, a smaller target is desired) can be applied to a target 30' (which may be smaller than convention, e.g., features of smaller pitch, if, for example, a smaller target is desired). Like reference numerals refer to like components throughout the figures.

Comparing the apparatus of FIG. 8 with that of FIG. 4, a first difference is the provision of an additional lens element 60 close to the target 30'. This additional lens is a miniature solid immersion lens (SIL), with a width (e.g., diameter) only on the order of a millimeter, for example in the range of 1 mm to 5 mm, for example about 2 mm. The SIL comprises, in an example, a hemisphere of material that receives rays of radiation at substantially normal incidence to its surface. In an embodiment, the SIL may be a different shape such as a super-hemisphere. In an embodiment, the SIL is made up of a material of refractive index n, such as glass, a crystal, fused quartz, a combination of materials, etc. Within the SIL material, the numerical aperture (NA) of the original rays is increased. The received rays come to focus at about the center of the hemisphere or the aplanatic point of a super-hemisphere and form a spot that is smaller by a factor of n (for a hemisphere) or $n^2$ (for an aplanatic super-hemisphere) compared to what would have been in the absence of the SIL. For example, a typical glass hemisphere having n=2 will reduce the width of the focused spot by a factor of 2. In an embodiment, the tip of the SIL 60 may be in the form of a truncated cone or pyramid shape with a generally flat surface, at the apex side, facing towards the target.

Immersion of optical elements in liquid has been used to increase resolution in microscopy and photolithography. The solid immersion lens may achieve similar gains, or even larger gains, without the inconvenience/problems of liquid immersion. However, to ensure that the increased NA does indeed increase the resolution of the system, the bottom of the SIL must either be in contact with the target 30 or positioned extremely closely to it.

A so-called micro-SIL may also be used. The width (e.g., diameter) of such a SIL is many times smaller, for example about 2 microns in width instead of about 2 millimeters. In an example where SIL 60 in the FIG. 8 apparatus is a micro-SIL, it may have a width (e.g., diameter) less than or equal to 10 μm, potentially less than or equal to 5 μm.

Whether a miniature or micro-SIL 60 is used, it can be attached to a movable support so that controlling the alignment and proximity to the substrate is much simpler than in the case of a lens with bigger width. For example, the SIL 60 in FIG. 8 is mounted to a frame 62. In an embodiment, frame 62 is movable. An actuator may be provided to move frame 62. In an embodiment, the frame 62 supports the objective 15. Accordingly, in an embodiment, the frame 62 may move both the objective 15 and the SIL 60 together. In an embodiment, the actuator for the frame 62 may be configured to move the frame 62 (and the SIL 60) in substantially the Z direction. In an embodiment, the actuator for the frame 62 may be configured to move the frame 62 (and the SIL 60) around the X axis and/or Y axis. In an embodiment, the SIL 60 is in relative fixed position relative to the frame 62. This may be referred to a single stage arrangement, where the objective 15 and SIL 60 are fixed relative to each and are moved by the actuator of frame 62. In such a case, a benefit may be that the SIL can be mechanically positioned in the focus of the objective.

As noted above, the SIL 60 in FIG. 8 is mounted to a frame 62, which in an embodiment supports objective 15. Of course, the SIL 60 may be mounted on a separate frame from that supporting objective 15. In an embodiment, the SIL 60 is connected to a frame (e.g., frame 62) via an arm 64 and actuator 66. Actuator 66 may be, for example, piezoelectric in operation or voice coil actuated. The arrangement where the SIL 60 has an actuator to cause relative movement between a movable objective 15 and the SIL 60 may be referred to as a dual stage arrangement. In a dual stage, certain functionalities may be separated. For example, the (relatively large) objective stage comprises the relatively heavy objective and can have relatively large motion range. In an embodiment, the objective stage may move only substantially in the Z-direction (substantially normal to the surface). Further, it can have a certain bandwidth (e.g., ~100 Hz) sufficient for relatively long displacement ranges, but perhaps not sufficient (e.g., too low bandwidth) for suppression of small position disturbances. The (relatively small) SIL stage comprises the relatively light SIL and can have a relatively small motion range. In an embodiment, the SIL stage may move in at least 3 degrees of freedom, e.g., in the Z-direction and around the X-axis and/or the Y-axis, to position the SIL substantially parallel to the surface. Further, it can have a certain bandwidth (e.g., sufficiently high) to suppress small position disturbances (e.g., up to several hundreds of nanometers). The SIL stage may not have a mechanical range sufficient to cover the desired full travel range. So, the SIL stage can be used to position the SIL at about 10-50 nm above the surface, while the objective stage can position the objective at focus with respect to the surface.

Actuator 66 may operate in combination with one or more other actuators positioning the objective as a whole in relation to the target. In relation to the coarse and fine positioners mentioned above, for example, the actuator 66 may be regarded as an ultra-fine positioner. The servo control loops of these different positioners can be integrated with one another. The components 62, 64 and 66, together with the substrate table and positioners (mentioned above but not shown in FIG. 8), form a support apparatus for positioning the SIL and the target T in close proximity to one another. As noted above, in principle, SIL 60 could be mounted rigidly to the frame 62, and/or may be of larger width. The separate arm and actuator allows easier control of the very small gap, as discussed in more detail below.

Inclusion of the SIL 60 opens the possibility of, for example, focusing to a much smaller spot S'. The SIL works by illuminating the target with both propagating and evanescent waves and capturing the near-field radiation (including waves that are evanescent in the gap) from the target, and to this end it is positioned substantially closer than one wavelength ($\lambda$) of radiation from the target structure, generally closer than a half wavelength, for example around $\lambda/20$. The closer the distance, the stronger will be the coupling of near-field signals into the instrument. The gap between the SIL 60 and target 30' may therefore be less than 100 nm, for example between 10 nm and 50 nm. Because the NA of the inspection apparatus is effectively increased, the sensitivity and parameter de-correlation is enhanced such that the pitch of the target periodic structure may be reduced.

In examples where a micro-SIL would be used, spatially incoherent radiation of the type conventionally used in, for example, a scatterometer cannot be focused to a micron-sized spot as small as the micro-SIL. Accordingly, in such an embodiment or in an embodiment using a macro-SIL (i.e., one larger than a micro-SIL) the radiation source 2 may be changed to a spatially coherent source. Therefore a laser source 70 is coupled to illumination optics 12, etc. via an optical fiber 72. The limit on the spot size on the substrate is set by the numerical aperture of the focusing lens system and the laser wavelength. As an additional benefit of using spatially coherent radiation, the instrument with laser radiation source 70 can be used to perform different types of scatterometry or measurement. For example, coherent Fourier scatterometry (CFS) may be used to measure the target.

As highlighted above, a small gap (e.g., a value in the range of 10-50 nm, e.g., 20, 25, 30, or 35 nm) should be maintained between the SIL and the target. But, regardless of the control mechanism used to establish, and maintain, the desired gap, it has been discovered that a variation in the surface of the SIL tip from an expected perfectly flat or curved surface thereof (hereinafter roughness) can yield errors in measurement results. And, it has been discovered that even a small roughness of the SIL tip may cause unacceptably large error in the determination of one or more parameters of interest derived from the measurement data.

As discussed above, a parameter of interest (e.g., critical dimensions (CD)) of a lithography target may be measured using radiation-based metrology (e.g., scatterometry) with a solid immersion lens (SIL). The lower surface of the SIL (SIL tip) is kept at a small distance (e.g., a gap in the range of 10-50 nanometers) from the target. The radiation reflected from the target, via the SIL tip, forms an intensity distribution (intensity pupil) in, e.g., the back-focal plane of an objective lens, which is imaged onto and measured using a detector (e.g., a CCD camera). The intensity distribution in the measured pupil depends on the size of the gap and the geometrical and optical properties of the target that is measured.

As discussed above, the geometrical and optical properties of the target are captured in a parameterized model (e.g., a model such as in FIG. 7), of which one or more parameters of interest (e.g., a CD parameter) form a subset. Using, e.g., a Maxwell solver, the values of the model parameters for the measured target are reconstructed in a computational post-processing of the recorded pupil that is called reconstruction.

In an embodiment, the model may include the gap as a floating parameter to be reconstructed. In an embodiment, the SIL tip may be represented as being perfectly flat.

In an embodiment, to enable relatively fast calculation using, e.g., a forward model Maxwell solver, typically only one or a few features of the periodic structure of a target are modelled. Periodic boundary conditions are then used to approximate the full periodic structure. An example of a model of a single feature of a periodic structure, for use in such calculations, is shown in FIG. 7, which depicts a SIL tip 750, the target feature and associated layers 700, 710, 720, 730, and the gap 740 between the SIL tip 750 and the target feature. As will be appreciated, the SIL, gap, target feature and/or layers may have different refractive index (e.g., a real or complex refractive index, refractive index tensor, etc.) as roughly represented in the FIG. 7 example by the different pattern fill.

But, as discussed above and shown in FIG. 7, the assumption in the model of a perfectly flat or uniform SIL tip 750 is not correct. In manufacturing, the surface of the SIL tip 750 is created by conventional polishing, chemical-mechanical planarization (CMP) and/or other processing method. A polished/planarized surface will always have a certain amount of roughness in the form surface roughness and/or waviness. Surface roughness is surface irregularities (height-variations) in the lateral dimensions that are smaller than the wavelength of the radiation used. Waviness is surface irregularities in the lateral dimensions that are larger than the wavelength of the radiation used. Roughness of a SIL tip 750 is on the order of nanometers or up to 10-20 nanometers, in amplitude for a well-polished SIL tip 750. Hereafter, roughness is discussed in terms of surface roughness but the techniques described herein may also or alternatively be used for waviness of the SIL tip 750. In an embodiment, the waviness of the SIL tip 750 may be less of an issue in practice in obtaining good results.

So, since the intensity distribution in the pupil is at least partly dependent on the gap 740, the pupil for a given target will be slightly different for a SIL tip 750 that is perfectly flat compared to a SIL tip 750 that possesses a certain roughness. Since the roughness is omitted in the model of, for example, FIG. 7, the difference in intensity due to the difference in gap distance because of the SIL tip roughness has to be accounted for during the reconstruction. Effectively this leads to a deviation of the reconstructed model parameters from what their values would have been if the SIL tip was perfectly flat in reality. As the metrology method aims for an accurate measurement of one or more parameters of interest, this variation is undesired and should be reduced or minimized.

To account for and represent the roughness, a height profile may be added to the model of the SIL tip 750. The height profile may be determined by, e.g., measurement of the tip of the SIL 60. However, as mentioned above, the calculations make use of the periodic nature of the one or more periodic structures of a target in order to speed up calculation time, i.e., to arrive at a result relatively quickly given that many targets will be evaluated and accordingly many periodic structure features would need to be evaluated. So, to perform realistic calculations (e.g., simulation) including a roughness profile, the modelled domain should be extended to be at least as large as the wavelength of the radiation in the lateral dimension. For small periodic features (pitches), this can mean 20-80 periodic structure features included in the reconstruction model. Such a multi-feature model may be called a super-cell, as distinguished from a unit cell where the model only contains one feature. But, with, e.g., numerical Maxwell solvers, the computation time scales in a non-linear way, e.g., with a third power of the modelled domain. So, for 50 periodic structure features, this means an increase of computation time by a factor of 125000, yielding days for the calculation of one pupil and probably weeks or months to do a single reconstruction on a dedicated computer.

Figure 9:
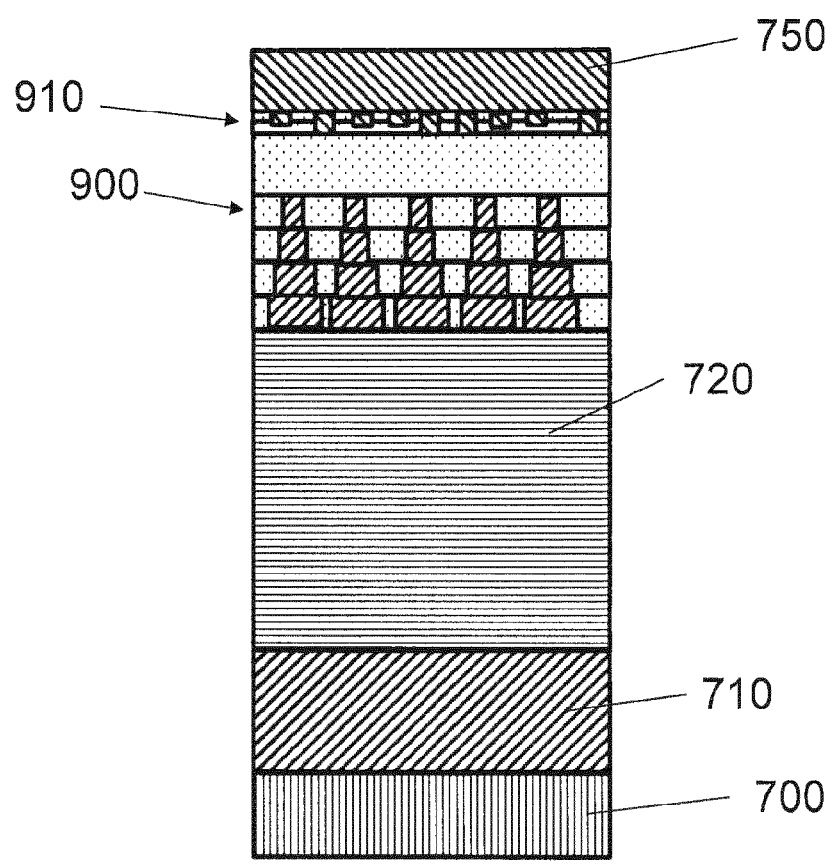
FIG. 9 schematically depicts an example of a supercell model of a plurality of features of a target along with a roughness of a tip of a SIL.
Figure 10:
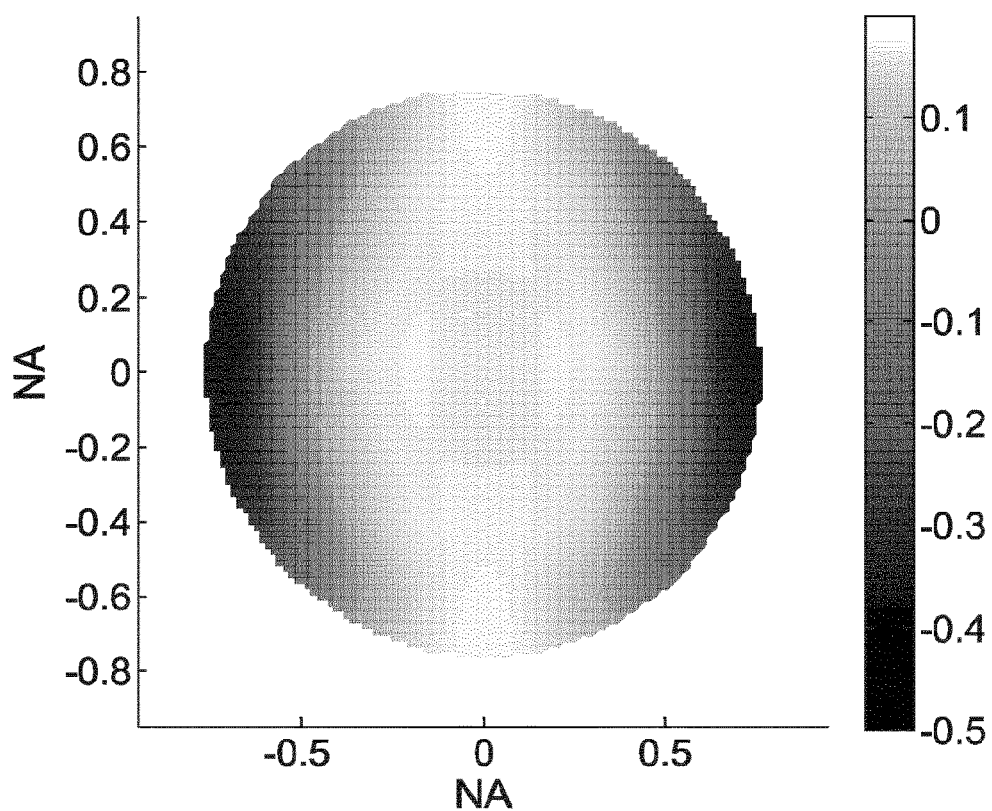
FIG. 10 shows simulated results of the difference between a pupil calculated using a supercell model including a SIL tip with roughness and a pupil calculated using a unit cell model with a perfectly flat SIL tip.

An example of a super-cell model of ten features 910 with added SIL tip roughness 910 is depicted in FIG. 9. FIG. 10 shows a difference between the two simulated pupils (delta-pupil), the first pupil being calculated using a super-cell model similar to FIG. 9 for a 45 nm pitch grating, with 10 grating lines in the model, and a random roughness of a SIL tip with an RMS of 0.2 nm and the second pupil being calculated using a unit cell model similar to FIG. 7 for the same grating, with a single grating line in the model, and with a perfectly flat SIL tip. As can be seen in FIG. 10, there is significant variation between the pupils. Reconstruction of a parameter, e.g., CD, based on the super-cell pupil using a unit cell model with a flat SIL tip may yield variation in the reconstructed parameter as large as one percent. Further, these variations are expected to increase for smaller pitches and/or shorter measurement beam wavelengths used. Moreover, a RMS of SIL tip roughness of 0.2 nm may be better than available in the current the state of the art for a SIL tip. Therefore, the SIL tip roughness will have a significant (negative) impact on the accuracy of parameter reconstruction.

So, in an embodiment, the optical effect of roughness can be modelled by an effective medium approximation (EMA), in which the roughness is replaced in the model by one or more continuous segments having an effective refractive index (e.g., a real or complex refractive index, refractive index tensor, etc.). For example, referring to FIG. 11, the roughness may be modelled by a single layer segment 1100 having an effective refractive index (e.g., a real or complex refractive index, refractive index tensor, etc.). In an embodiment, the roughness may be represented by a plurality of segments (e.g., layered segments), each having a respective effective complex refractive index (e.g., a real or complex refractive index, refractive index tensor, etc.). The one or more segments may further have an associated thickness.

An example of such an EMA is Bruggeman's EMA, in which the roughness is replaced by a single layer of thickness T and effective refractive index neff. Other EMA's include Maxwell-Garnett Theory, Drude, Volume Averaging Theory, Lorentz-Lorenz, Parallel and/or Series EMA. Any EMA model is determined by a set of parameters, which will be referred to as the EMA parameters.

Figure 11:
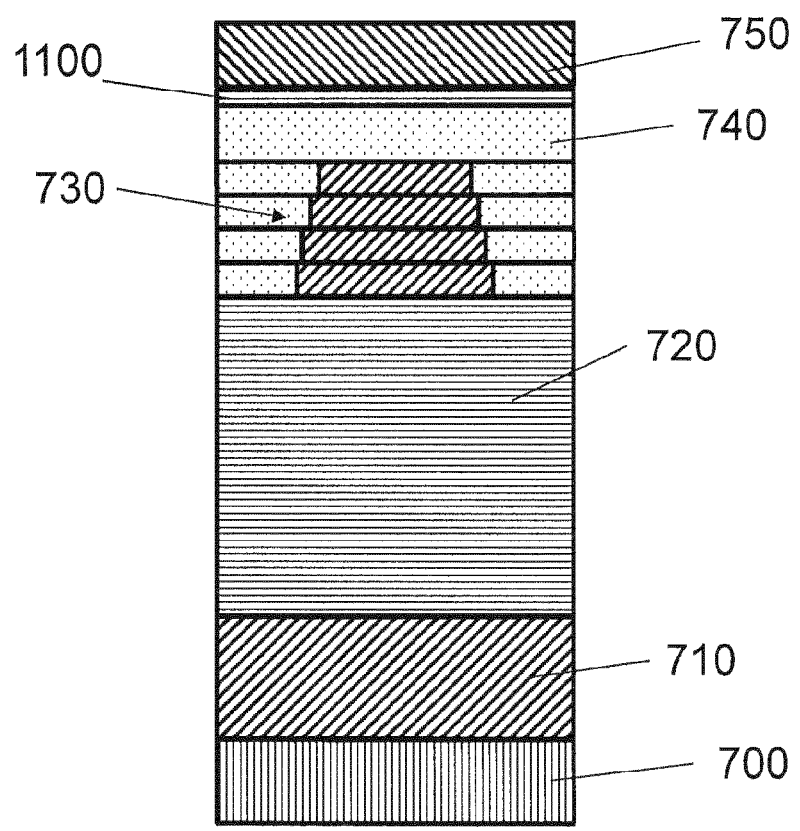
FIG. 11 schematically depicts an example unit cell model of a feature of a periodic structure of a target including an effective medium approximation for SIL tip roughness.

Using a simulation with a known roughness applied in a supercell like in FIG. 9 and a simulation using a unit cell model like in FIG. 11 with an EMA parameterized using the same roughness, a good qualitative agreement between the respective pupils was found. Further, quantitatively, the pupils differed by a proportionality factor (that was essentially constant) due to the EMA model of choice. It was discovered that the proportionality factor is independent of type of fiducial (as further discussed below), gap or roughness RMS.

In an embodiment, the values of EMA parameters (e.g., the values of T and neff) could be estimated by calculation and/or measurement. To do so, relatively detailed knowledge on the surface morphology would be needed. In an embodiment, the surface roughness and/or refractive index may be measured and used as inputs into one of the applicable EMA models and so values of EMA parameters may be determined.

In an embodiment, the values of EMA parameters (e.g., the values of T and neff) may be obtained from a calibration procedure that is relatively quick and low cost. Such a calibration method can also allow for more complicated EMA models to be used. Examples are: (1) a multi-segmented model in which each segment layer has a different effective refractive index and/or thickness; or (2) a density gradient, where the refractive index (e.g., a real or complex refractive index, refractive index tensor, etc.) has a function of distance (e.g., height, thickness, etc.), e.g., is determined by a parameterized function.

In an embodiment, to calibrate the EMA parameters of a certain model geometry and to reduce mathematical and/or measurement complexity in arriving at the EMA parameters, a reference sample surface (fiducial) that is generally plane and with accurately known optical parameters is used. Radiation is then passed through the SIL 60 (and its rough tip) onto the fiducial. The redirected radiation is passed to a detector, where one or more intensity pupils of such redirected radiation are measured. Then, a mathematical calculation process, such as a mathematical reconstruction process similar to as discussed herein (such as in respect of FIG. 6), may be used to derive one or more parameters of the EMA model.

Figure 12:
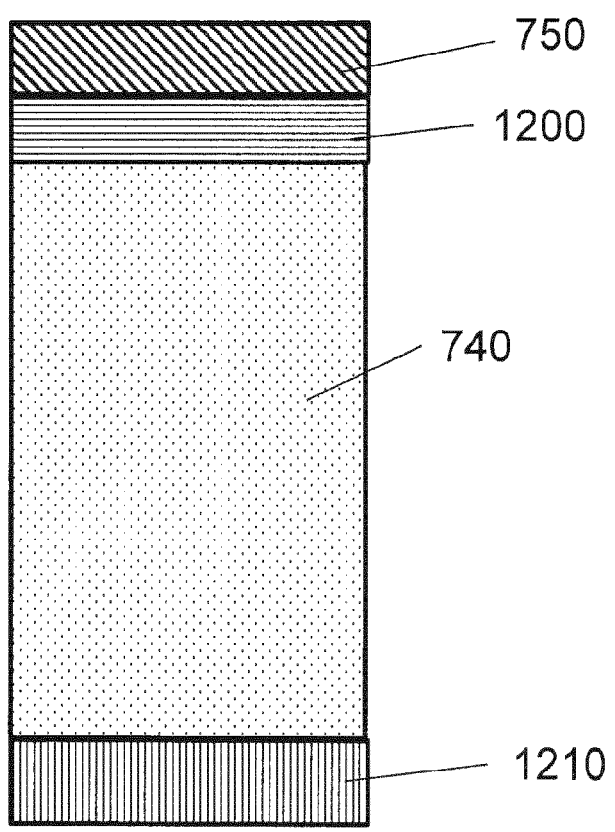
FIG. 12 schematically depict an example unit cell model for a fiducial.

Accordingly, in an embodiment, the fiducial is modelled as being essentially or perfectly flat. FIG. 12 shows an example unit cell model therefor. FIG. 12 depicts a fiducial represented by segment 1210 spaced by a gap (represented by segment 740) from a SIL tip represented by segment 750. FIG. 12 further shows the EMA for the SIL tip represented by segment 1200. As will be appreciated, the segment 1200 may comprise, e.g., multiple layered segments and/or have a gradient. So, in this model assuming essentially perfect flatness of the fiducial, the only floating parameters are the gap 740 and the EMA parameters for the EMA segment 1200.

So, for an assumption of essentially perfect flatness to hold, the fiducial should be desirably atomically flat over the whole tip of the SIL 60, which may be tens, if not up to several hundred, micrometers in width (e.g., diameter). Thus, in an embodiment, the fiducial surface comprises a solid material and/or liquid material.

In an embodiment, the solid material for the fiducial comprises Ag, GaP, Si, SiC, BP, Cu, $Ta_2O_5$ and/or Al. In an embodiment, the solid material comprises a crystal, such as mica. In an embodiment, the solid material comprises a metal. These materials may either directly form the fiducial surface, or may serve as a support for one or more layers described hereafter. The atomic flatness may be achieved by, for example, cleaving (e.g. crystals such as mica), mechanical polishing (e.g., silicon and/or metal), chemical polishing (e.g., silicon and/or metal) and/or heat treatment (e.g., in ultrahigh vacuum).

In an embodiment, the liquid material for the fiducial comprises a liquid metal. In an embodiment, the liquid metal comprises GaInSn or Hg. Thus, in an embodiment, to improve the manufacturability and/or handling of a fiducial, a liquid metal may be used to create at least part of the atomically flat fiducial, which may have favorable self-cleaning properties due to its high mobility.

In an embodiment, one or more layers (e.g., coating, thin film, etc.) may be provided on top of the solid or liquid material. The one or more layers may include repeating two or more layers of the same material, or of different materials, successively to create relatively thick multilayer stacks. The layers can facilitate, for example, changing the refractive index, improving flatness, improving inertness/stability, and/or improving ease of handling. To change the index of refraction, a relatively thick layer is needed. For example, one or more of the solid materials described herein. For other reasons, a thin film may suffice, with the thinner the better to limit the effect on refractive index.

In an embodiment, one or more of the layers may comprise a metal, e.g. Al, Cu, Ag, and/or Au. In an embodiment, one or more of the layers may comprise an oxide, e.g. native $SiO_2$ on Si, thermal $SiO_2$ on Si, native $Al_2O_3$ on Al, or epitaxial $Al_2O_3$ on NiAl(110). In an embodiment, one or more of the layers may comprise a 2d nanomaterial, such as single or multilayer graphene, hexagonal boron nitride, or a transition metal dichalcogenide nanolayer, e.g. $MoS_2$, $WS_2$.

In an embodiment, one or more of the layers may comprise an organic material or an organometallic material.

In an embodiment, a mica or other surface may be used as a template to create an atomically flat metal layer, such as of gold and/or silver, as all or part of the atomically flat fiducial. In an embodiment, all or part of the atomically flat fiducial may be of silicon.

In an embodiment, a material of the fiducial should be chosen such that the detected pupil is most sensitive to roughness of the SIL tip. In an embodiment, such sensitivity scales separately with the real part nf and imaginary part κf of the complex refractive index of the fiducial. But, the resulting intensity variations in the pupil associated with the real part nf and imaginary part κf of the complex refractive index have opposite signs, however. So, the highest sensitivity may be achieved by using a fiducial comprising one or more materials with 1) high nf and low κf or 2) low nf and high κf, to help prevent a partial cancellation of the contributions of both nf and κf.

Accordingly, one or more different materials are proposed for use in forming the fiducial. Furthermore, certain of the various materials are desirably used at different measurement beam wavelengths. In an embodiment, Ag, GaP, Si, SiC and/or BP are appropriate materials (high nf, low κf, particularly for the visible wavelength region. In an embodiment, Cu is an appropriate material (high κf, low nf), particularly for radiation with a wavelength around 700 nm. In an embodiment, $Ta_2O_5$ is an appropriate material (relatively high nf, a very low κf), particularly for both UV and visible wavelengths. In an embodiment, Al is an appropriate material (high κf, low nf), particularly for radiation in the UV region.

Many of these materials react with oxygen (such as in air). For example, Si, Al and Cu exposed to oxygen can become covered with a thin oxide film. The oxidation process would typically increase the roughness of the fiducial and thus affect the calibration. A non-oxidizing metal, such as Ag and Au, attracts organic/organosulfur contamination from the environment (e.g., air), which will similarly affect the calibration. So, in an embodiment, the fiducial may have thereon one or more layers of a certain material such that the fiducial becomes, for example, more inert and/or easier to handle without destroying the flatness of the fiducial. Examples include Al crystal with native oxide, NiAl(110) crystal with a layer of epitaxial aluminum oxide, and/or sapphire with a layer of copper with a single layer of graphene. In these cases, the fiducial should be modelled as a multi-layered stack (e.g., segment 1200 comprises multiple layered segments, each representing the different materials in the fiducial stack), possibly decreasing the accuracy of the calibration method.

These various materials and techniques are not exhaustive. Other materials and/or techniques may be used to provide a fiducial with the proper optical properties and that forms an essentially atomically flat surface that is, for example, stable in operating conditions.

It also may be that a certain material possesses good optical properties for a fiducial, but cannot be easily obtained with a large enough atomically flat surface area, or with a sufficiently flat surface. In such a case, a second EMA can be used in the model to mimic the fiducial surface roughness. For example, a segment located above segment 1210 in FIG. 12 that is similar to segment 1200 to model the roughness of the fiducial. The second EMA is parameterized with values of, e.g., the effective refractive index (e.g., a real or complex refractive index, refractive index tensor, etc.), the thickness, etc. Like the EMA for the SIL tip, it can be multi-segment and/or have a gradient. The roughness of the fiducial may be measured with, e.g., atomic force microscopy and/or phase contrast microscopy to obtain a calibration for the EMA modelling the roughness of the fiducial. In case the refractive index of the fiducial is close to that of the SIL 60 material, cross talk between the two sets of EMA parameters may exist. For a high κf fiducial material, this could be resolved relatively easily, since the SIL has a relatively high n and may have low, close to zero, κ. Otherwise, different measurements of the intensity pupils may obtained for use in de-correlation of the two sets of EMA parameters.

Figure 13:
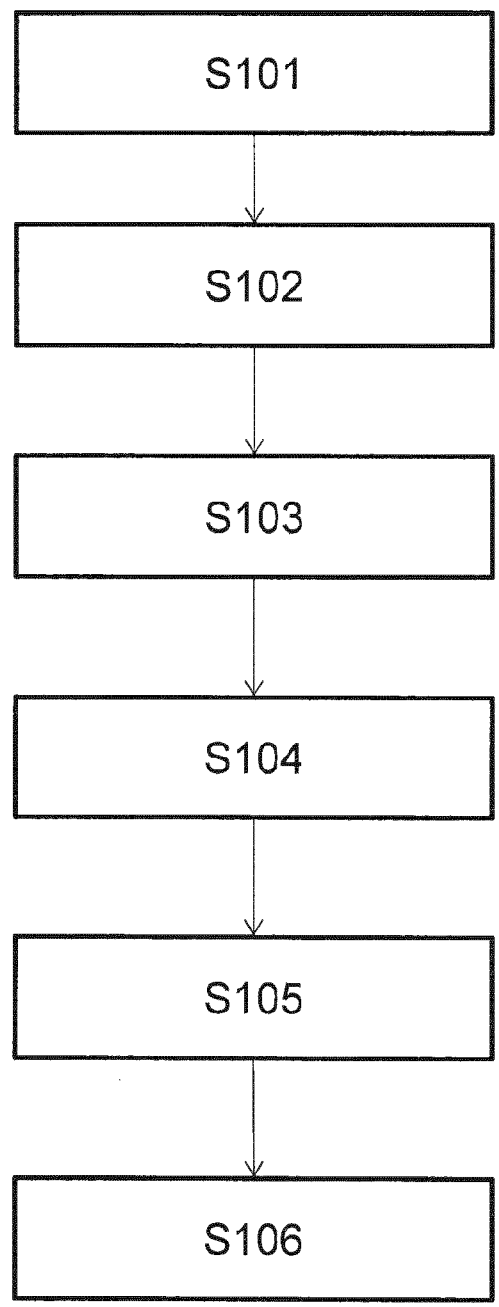
FIG. 13 depicts a flow diagram of a process to derive an effective medium approximation for SIL tip roughness.

So, in summary and referring to FIG. 13, the roughness calibration procedure may comprise selecting at S101 an atomically flat fiducial (or a well-characterized non-flat fiducial) of high-κ or high-n material, which is provided in an inspection apparatus having a SIL 60 tip for which an EMA representing the roughness of the SIL 60 tip is desired to be determined. At S102, radiation of appropriate wavelength for the fiducial is passed through the SIL 60 and onto the fiducial and radiation redirected by the fiducial is measured using a detector to obtain one or more intensity pupils. At S103, steps S101 and S102 can be repeated for different illumination wavelengths and/or polarization states. Different wavelengths, for example, may require a different fiducial.

At S104, per wavelength and/or polarization state, the recorded pupils are calculated using a model that, in an embodiment, only contains segments for the fiducial, the SIL and the EMA, such as the model of FIG. 12. One or more of the EMA parameters (e.g., optical and/or thickness parameters) and the gap between the SIL and the fiducial are floating parameters of the model that are varied to arrive at a calculation of the pupils that correspond to the recorded pupils. A match between a recorded pupil and a calculated pupil indicates that the one or more EMA parameters closely estimate the optical response to the roughness of the SIL 60 tip.

In an embodiment, steps S101 and S102, steps S101, S102 and S103 or steps S101, S102, S103 and S104 may be repeated at a subsequent period of time after the inspection apparatus has been used to measure one or more targets. So, in an embodiment, the EMA parameters of the inspection apparatus may be re-calibrated after a period of use of the inspection apparatus measuring one or more targets.

At S105, an EMA, such as segment 1100 in FIG. 11, is provided to a periodic structure model (unit cell), such as depicted in FIG. 11, used for reconstruction of one or more parameters of the target periodic structure (e.g., target grating) to be measured. The EMA parameters for segment 1100 are based on the values obtained in step S104 for the one or more specific measuring beam wavelengths and/or polarization states used for the target periodic structure. In other words, the EMA parameters for a matching set of recorded and calculated pupils for a particular measuring beam wavelength to be used to measure the target periodic structure are applied to the EMA 1100 in the model (such as in FIG. 11) used to reconstruct the target periodic structure measured using the particular measuring beam wavelength.

At S106, one or more target periodic structures are exposed to one or more measuring beam wavelengths and the redirected radiation is measured to obtain one or more measured intensity pupils. The measured intensity pupils are then used as part of a reconstruction using the model of S105 for the one or more measuring beam wavelengths. The reconstruction can result in the derivation of one or more parameters of the measured target periodic structure, such as CD.

In an embodiment, the EMA may be used to "backwardly" derive one or more roughness parameters (e.g., Ra, RMS, etc.) of an optical component (e.g., a different optical component), a fiducial or a target. That is, a radiation intensity distribution may be measured using an optical component at a gap from a surface. Then, the roughness parameter may be determined using the measured radiation intensity distribution and a mathematical model describing the surface, the model comprising the effective medium approximation for roughness of a surface of an optical component or a part thereof.

For a given SIL 60 or inspection apparatus, one or more of the determined EMA parameters or measured fiducial data can be stored in a memory (such as the one or more determined EMA parameters or measured fiducial data, obtained over time after use of the inspection apparatus to measure one or more targets on one or more substrates) so that such one or more parameters/data, or one or more parameters derived therefrom (e.g., statistics), can be used in one or more subsequent determinations of one or more EMA parameters or with one or more other evaluation techniques. For example, the one or more determined EMA parameters or measured fiducial data, or one or more parameters derived therefrom, may be used in a machine learning or statistical technique to make one or more subsequent constructions or derivations of one or more EMA parameters for a SIL 60 tip. Such a technique may be Bayesian regularization. Thus, for example, one or more prior determined EMA parameters or measured fiducial data, or one or more parameters derived therefrom (e.g., one or more statistics), may be used in a Bayesian regularization to derive new values of EMA parameters.

In an embodiment, one or more of the determined EMA parameters or measured fiducial data, or one or more parameters derived therefrom (e.g., one or more statistics), may be used as a quality indicator for the SIL tip and/or the fiducial. For example, one or more of the EMA parameters or measured fiducial data, or one or more parameters derived therefrom, may give an indicator for the flatness/roughness of the SIL tip and/or the fiducial. In an embodiment, when one or more determined EMA parameters or measured fiducial data, or one or more parameters derived therefrom are found to be out of a pre-set bound or cross a threshold (e.g., when one or more EMA parameters or measured fiducial data are more than or equal to 3%, 5%, 10%, 15%, 20%, 25% or 30% different than an earlier value of the one or more EMA parameters), a signal may be given. In an embodiment, a signal may be given as a diagnostic, e.g., to warn of the desirability of, or cause, servicing (e.g., cleaning) or replacement of the SIL and/or fiducial. For example, the signal may be used to trigger or control one or more parameters of a cleaning unit (e.g. a burnishing tape, a microfiber wiping tool, an (ionized) cleaning gas nozzle near the SIL and/or fiducial, a plasma cleaning unit, etc.) to clean the SIL 60 and/or fiducial. That is, in an embodiment, the signal triggers cleaning by, or controls one or more cleaning parameters of, a cleaning unit of the SIL and/or fiducial. In an embodiment, the cleaning unit may be located inside the inspection apparatus. In an embodiment, a signal may be given that a measurement using a substrate should be stopped or suspended. Further, using the stored one or more determined EMA parameters or measured fiducial data, it may be possible to predict when one or more EMA parameters or measured fiducial data are expected to be out of a pre-set bound (and thus initiate a signal for, e.g., servicing of the SIL and/or fiducial) by extrapolating a trend in the one or more determined EMA parameters or measured fiducial data. That is, in an embodiment, one or more determined EMA parameters or measured fiducial data may be used to predict if and/or when the one or more EMA parameters or measured fiducial data will cross a threshold and provide a signal thereof (e.g., a signal that servicing of the SIL and/or fiducial is desired).

Further, for effective control of the positioning of a component relative to a surface, it is desired that the gap between the component and the surface is accurately known. For example, during target measurements by the SIL-based measurement, a gap error signal (GES) can be used to control the gap between the SIL 60 tip and the target.

But, in a real system, the measurement signal may not be accurate, assumptions about the system (e.g., component size) may not always be valid, etc. For example, the gap between the component (e.g. SIL) and the target surface may be represented by a gap error signal (GES). If control is based on the GES, a calibration may be needed to help ensure that the gap between the component and the target surface is a certain expected gap (e.g., so as to avoid collision and to attain desired measurement conditions).

Additionally, the measurement of the gap may be strongly dependent on the structure that is on the target surface (e.g., etched on the substrate surface). That is, the GES may be strongly dependent on the structure on the target surface. In particular, the offset of the GES may vary substantially with the type of target structure, which introduces, for example, a serious risk of collision of the SIL with the target. So, for example, if the GES is controlled at a value that corresponds to, e.g., 20 or 50 nm for a given structure, that structure might be controlled to be close to the desired 20 or 50 nm. However, another structure at that GES may already touch the SIL. So, deviation in the structure, e.g., because of a wrong user input, may cause the GES to vary significantly from an expected value. Such a deviation may result in, for example, the SIL bumping into the target surface, thus making the apparatus and the target surface susceptible to an unacceptable risk of damage.

Therefore, there is provided a method of calibrating the GES, a measured gap distance and/or a setpoint value.

To enable the calibration, in an embodiment, a trigger signal is generated from one or more other measurable signals in the control loop, or one or more signals derived from the one or more measurable signals (such as a control error signal, the control error signal being a measure of the difference in a measured gap distance between the component and the surface and a desired gap distance between the component and the surface). In an embodiment, the control error signal is the GES or based on the GES, e.g., a difference between the setpoint value of the gap distance and the measured gap distance based on the GES. Alternatively or additionally to the control error, one or more other measurable signals in the control loop, or one or more signals derived from the one or more measurable signals, can be used as a trigger signal.

The slope of GES at small gaps (i.e., <λ/4 nm) remains approximately constant for different structures. So, the GES is, therefore, a suitable control signal for gradually decreasing the gap between the component and the surface. Further, when gradually decreasing the gap between the SIL and target surface, the error in GES (i.e., control error) suddenly starts to increase non-linearly when it encounters instability. This instability may be attributable to Van der Waals, electrostatic or other interactions arising at sub-micron distances (generally herein proximity forces or stiffnesses). In particular, for perfectly conducting, parallel plates, this Van der Waals interaction results in an approximate attractive Casimir force given by the equation:

$$F_{cas} = \frac{\hbar c \pi^2 A}{240 z^4} \qquad \text{Equation (1)}$$

where $\hbar$ is the reduced Planck's constant, and is equal to $h/2\pi$, h being the Planck's constant=$6.624e^{-34}$ Js, c is the speed of light ($3e^8$ m/s), A is the area of SIL tip surface in proximity to the target surface, and z is the gap separating the SIL tip surface from the target surface. Note, as discussed below, the result from Equation (1) may need to be varied to account for different materials, different topography, etc. Moreover, at very small separations of the two plates (e.g., up to about several 100 nanometers), the force can scale at $1/z^3$ instead of $1/z^4$. See, e.g., A. Rodriguez et al., "The Casimir effect in microstructured geometries", Nature Photonics, Vol. 5, pages 211-221 (2011), incorporated by reference herein in its entirety.

This approximate attractive Casimir force can be further expressed as being a result of a spring having a stiffness $k_{cas}$ given by:

$$k_{cas}(z) = \frac{\partial F_{cas}}{\partial z} = -\frac{\hbar c \pi^2 A}{60 z^5} \qquad \text{Equation (2)}$$

Apart from the Casimir force and stiffness given by Equations (1) and (2) above, force and stiffness due to electrostatic interaction also becomes significant at such small gaps. For electrostatic force between perfectly conducting, parallel plates, the electrostatic force between the SIL tip surface and a target surface is approximately given by:

$$F_{es} = \frac{\epsilon_0 A V^2}{2 z^2} \qquad \text{Equation (3)}$$

where V is the voltage difference between the SIL tip surface and the target surface, z is the gap separating the SIL tip surface from the target surface, surface, A is the area of SIL tip surface in proximity to the target surface, and $\epsilon_0=8.85e^{-12}$ Farad/m. The electrostatic stiffness is therefore:

$$k_{es}(z) = \frac{\partial F_{es}}{\partial z} = -\frac{\epsilon_0 A V^2}{z^3} \qquad \text{Equation (4)}$$

So, the instability in the error in GES (i.e., control error) may be attributable to one or proximity stiffnesses, e.g. Casimir stiffness or a combination of Casimir stiffness and electrostatic stiffness. In many instances, the electrostatic force is unknown because the voltage difference between the SIL and the substrate is unknown. But, electrostatic forces, where present, are an additional component to the Casimir forces. So, for example, a threshold based on Casimir forces alone is effective as, for example, a safety trigger, even if electrostatic forces are present.

That is, in an embodiment, the trigger signal may be evaluated whether it passes a threshold to determine proximity of the component to the surface. Thus, the instability and/or non-linearity may be used to timely determine a threshold proximity of the component to the surface (e.g., a risk of the component crashing into the target surface). So, the control error can be used to sense the proximity of the component to the target surface, which may, for example, trigger a safety mechanism that, for example, retracts the component or discontinues its movement. An appropriate threshold may be applied to the signal to determine the point where the instability occurs or a point just in advance of the instability. In an optical system using a SIL, increasing the gap between the SIL and the target surface may be an action taken when an instability of the control loop is encountered. However, in some embodiments, other actions such as stopping the motion of the SIL and/or analyzing the structure on the target surface interacting with the SIL may be performed.

In an embodiment, the GES signal can be a normalized signal with respect to its far field intensity. As a result, the normalized GES signal value for control may be between 0 and 1, substantially independent of the properties of the illumination.

In an embodiment, the trigger signal relatively suddenly increases or decreases as the instability approaches. The sudden change is caused by the relatively very non-linear characteristics of one or more of the proximity stiffnesses, such as the Casimir stiffness and/or electrostatic stiffness given by Equations (2) and (4), respectively.

In an embodiment, the trigger signal may be, for a certain moving time window (e.g., like a moving average), a maximum absolute value of the signal (e.g., control error). In an embodiment, the trigger signal may be a norm-based quantification of the size of the signal, such as the maximum absolute value of the signal (e.g., control error) for a moving time window of that signal. Other examples of trigger signal include a root-mean-square (RMS) value of the signal (e.g., control error) for a moving window of that signal, and/or energy content (e.g., RMS) of the signal (e.g., control error) for one or more specific frequencies indicative of control loop instability for a moving window of that signal. In an embodiment, the moving window is in the range of 0-100 ms, for example, 0-20 ms, for example 1 ms, 2 ms or 10 ms. The applied window size can depend on the approach speed of the SIL with respect to the surface and the frequency content of the relative vibrations between the SIL and the surface. The trigger signal may be normalized in some embodiments. By generating the trigger signal based on relative change in the control error, the influence of vibrations (e.g., of the substrate or the inspection apparatus) on the control error may be cancelled out.

Additionally or alternatively to the use of the trigger signal as a "safety" mechanism, the instability and/or non-linearity may be used for calibration. That is, ideally, the measured gap distance and the actual gap distance are the same. In reality, however, the measured gap distance may be different from the actual gap distance because of various reasons. The measured gap distance, a gap error signal and/or a setpoint value, in such cases, may need to be corrected using a calibration or correction factor. As such, a method for calibrating a measured gap distance, a gap error signal and/or a setpoint value is disclosed herein.

As noted above, recognizing that an instability in the control loop (which is manifested in the GES) occurs when a component closely approaches a surface and that such instability arises from the microscopic forces at play at such small distances, the instability can be used as a means to calibrate the gap error signal, a measured gap distance and/or a setpoint value.

Indeed, ideally, if the structure is known, the GES is known. So, there may not be any need for calibration based on proximity forces, such as Casimir and/or electrostatic force. But, if the structure is not fully known, the GES may have a (significant) error. Therefore, the GES may be calibrated based on calculations of the applicable proximity forces or stiffnesses. For example, Casimir stiffness is expected to have a small error due to its strong dependency on the gap and relatively weak dependency on the structure. Hence, the Casimir stiffness can be a way to calibrate, for example, the GES where, for example, the structure is not fully known.

So, in an embodiment, for a component of known surface area, the Casimir stiffness and/or electrostatic stiffness, given by Equations (2) and (4) respectively, is dependent only on the gap between the component and the surface. So, an estimated value of the absolute gap between the component and the surface (i.e., an estimated gap distance) can be calculated using Equation (2) and/or Equation (4) from a value of stiffness that destabilizes the control loop for positioning the component. But more generally, in an embodiment, an estimated value of the absolute gap between the component and the surface (i.e., an estimated gap distance) can be calculated using one or more other equations governing proximity stiffness from a value of stiffness that destabilizes the control loop for positioning the component.

As discussed above, these calculated values may be altered by a constant or parameter to account for one or more characteristics of the component and/or surface, and/or variation in the one or more characteristics. The constant or parameter may be derived by simulation and/or calibration.

Further, a gap signal indicative of the gap distance between the component and the surface may be evaluated to identify an instability in the control loop, which instability is manifested in the gap signal. That instability occurs due to the forces that play a role at small distances of the order of nanometers to hundreds of nanometers. The gap distance at the instability in the gap signal can be termed as a reference gap distance. In an embodiment, the gap signal may be, for example, the GES, or a control error signal from the control loop used for positioning the component relative to the surface, or other measured or derived signal from the control loop as discussed above. In some embodiments, the gap signal may be further derived from the control error signal (e.g., the trigger signal discussed above). For example, the gap signal may be a norm-based quantification of the size of the measured or derived signal for a moving window of that signal, such as a maximum absolute value of the measured or derived signal (e.g., control error) for a moving window of that signal, a root-mean-square value of the measured or derived signal (e.g., control error) for a moving window of that signal, and/or energy content of the measured or derived signal for a specific frequency indicative of control loop instability for a moving window of that signal.

The reference gap distance and the estimated gap distance are then evaluated against each other. In an ideal system, the reference gap distance is equal to the estimated gap distance that is calculated based on the one or more proximity stiffness (e.g., Casimir and/or electrostatic stiffness) formulas. So, if they are equal, the system is already calibrated. However, since a system may deviate from ideal behavior, the reference gap distance may be different from the estimated gap distance. Accordingly, a correction or calibration factor may, thus, be determined where the reference gap distance and the estimated gap distance are different. For example, a correction or calibration factor may be determined from the difference between the reference gap distance and the estimated gap distance and may be applied to the GES signal, to a measured gap distance, and/or to a setpoint value of the control loop. As another example, the corresponding GES values can be set as a lower set point (i.e., threshold) for the given structure on the substrate, and so be used to, for example, trigger a safety mechanism for avoiding the crashing of the component with the surface.

The correction or calibration factor may be determined once per metrology/inspection target, per substrate, or per batch of substrates, dependent on the expected structure variations between targets/substrates/batches.

In an embodiment, it may be desirable to isolate the Casimir force (or one or more other proximity forces) as being the only significant force causing the instability in the GES of the component and so only the reference distance calculated for the Casimir effect (or other proximity effect) may be needed. To do so, in an embodiment, a voltage difference between the component and the surface may be eliminated, thereby eliminating the electrostatic stiffness attributable to the voltage difference between the component and the surface. The voltage difference may be eliminated by any known method such as providing a conductive coating on the surface of component and/or the target surface and grounding both the surfaces.

In an embodiment, instead of eliminating the voltage difference between the component and the surface, a known voltage difference may be provided or the voltage difference may be determined. In such an embodiment, if the area of the surface of the component interacting with the target surface is known, the total stiffness (i.e., combination of proximity stiffnesses) is still dependent on the gap between the component and the surface. Thus, for a known or measured voltage difference, the reference distance can still be calculated based on a value of stiffness that destabilizes the gap signal. Because the non-linearity for the electrostatic stiffness is lower than the non-linearity of, e.g., the Casimir stiffness (power of −3 as against power of −5), the calculation of gap distance using the combination of electrostatic stiffness and one or more other proximity stiffnesses may not be as robust as using the non-electrostatic proximity stiffness alone. The known voltage difference should be sufficiently low to avoid voltage breakdown between the component and the surface.

Figure 14:
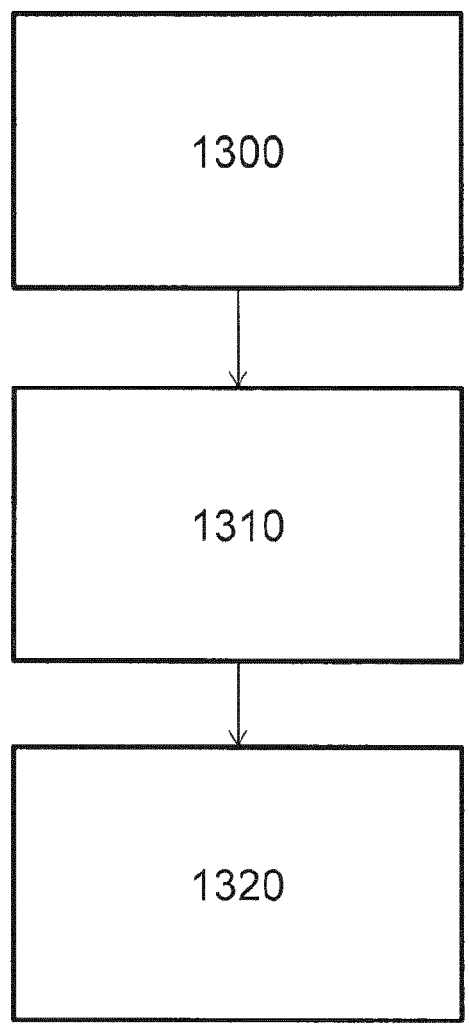
FIG. 14 depicts a flow diagram of a process to calibrate a measured gap distance, a gap error signal and/or a setpoint value using a proximity force or stiffness calculation.

FIG. 14 depicts an example flow chart of a process to calibrate a measured gap distance, a gap error signal and/or a setpoint value. The method includes, at block 1300, for a value of a stiffness that destabilizes a control signal for positioning a component relative to a surface, calculating an estimated gap distance between a component and a surface based on one or more proximity (e.g., Casimir and/or electrostatic) stiffnesses between the component and the surface. At block 1310, a gap signal related to a gap distance between the component and the surface is evaluated to identify an instability in the gap signal, the gap distance at the instability being a reference gap distance. At block 1320, the reference gap distance is evaluated against the estimated gap distance to arrive at a correction factor for positioning of the component relative to the surface.

Thus, in an embodiment, there is provided a method that uses an "absolute gap measurement" to calibrate the offset in the GES by making use of one or more proximity forces or stiffnesses. In this method, in effect, one or more proximity stiffnesses is detected by the control loop, from which the absolute gap can be derived using one or more applicable theoretical proximity force or stiffness formulas. This method is relatively robust to estimation errors in the proximity stiffness due to the non-linear relation with the gap, where estimation errors could arise due to (1) a (relatively small) dependency on the target type and (2) a discrepancy between the theoretical and actual proximity force or stiffness.

But, in an embodiment, this calibration method using a proximity force or stiffness calculation may benefit from a further calibration in which the gap could be obtained independently with a sufficient level of accuracy, by "calibration" of the theoretical proximity force or stiffness formula to the specific application, e.g., with a constant scaling factor.

So, in an embodiment, since the boundary conditions of the roughness calibration described above are well defined (atomically flat surface, well defined optical properties of the fiducial, etc.) and the "target" (i.e., the fiducial) is simple (e.g., it has no grating structure with multiple layers), the expected accuracy of the gap determined from the calibration calculation is large. Thus, the fiducial calibration as described above can provide an independent determination of the gap to calibrate one or more parameters in the calibration method using the proximity force or stiffness calculation.

Figure 15:
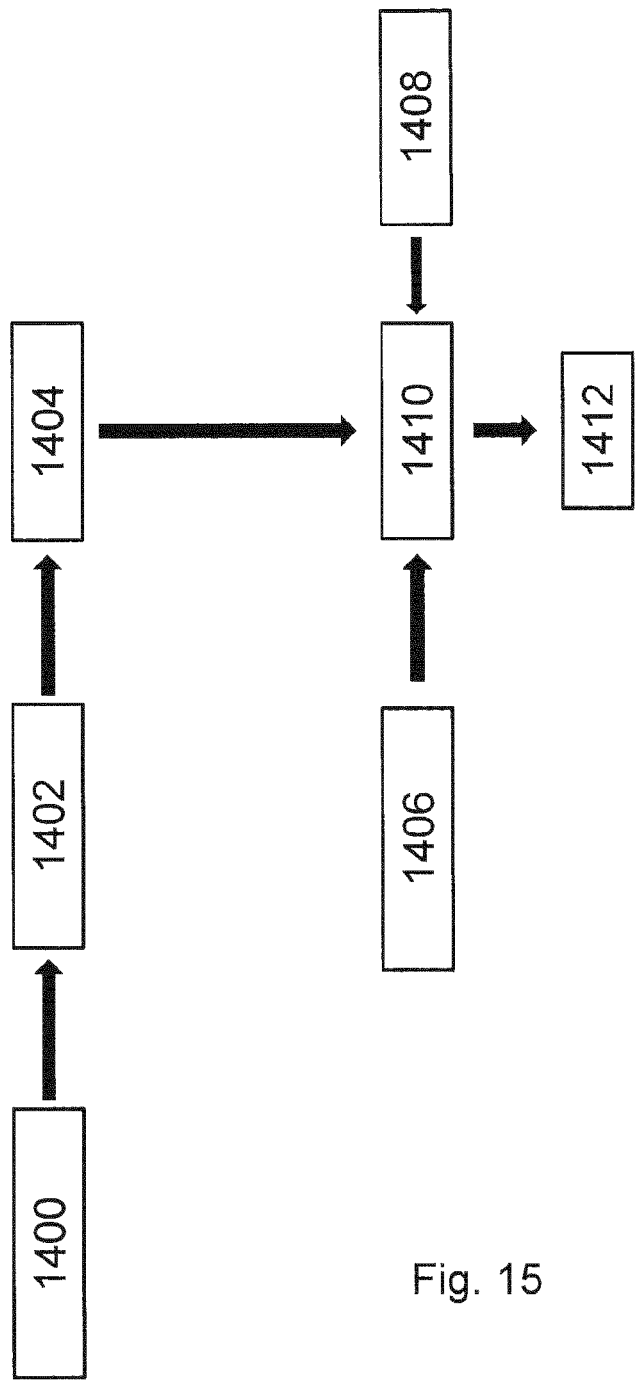
FIG. 15 schematically depicts a flow diagram of a process to derive one or more parameters of interest of a target based on a measured data obtained using a SIL.

FIG. 15 schematically depicts a flow diagram of a process of reconstruction using a model, comprising an effective medium approximation, of one or more parameters of a target measured using a SIL. At 1400, a nominal parametric model for the target structure is set up (e.g., with dimensions of one or more layers associated with the target, one or more refractive indices of one or more layers, nominal gap value for measurement, measured radiation wavelength and/or polarization, etc.). At 1402, optionally, a calibration method using a fiducial as described herein is performed to derive one or more parameters of an effective medium approximation of roughness of a SIL tip. At 1404, the nominal parametric model includes an effective medium approximation of the roughness of the SIL tip, which may be parameterized using measurements of the SIL tip and/or parameterized using the one or more parameters from 1402.

At 1406, an ideal pupil (radiation distribution) expected from measuring the target with a measurement beam using the SIL is calculated using the parametric model of 1404. At 1408, a radiation intensity distribution is measured for the target using the SIL.

At 1410, the radiation intensity distributions are applied to a reconstruction process to derive one or more parameters of interest 1412 of the target. For example, the process of FIG. 6 may be used at 1410. If the process of FIG. 6 were used, the parametric model of 1404 may be substituted for the parameterized model 206.

Thus, in an embodiment, an effective medium approximation of SIL tip roughness is used in the modeling, e.g., reconstruction of a parameter of interest from measured radiation. Further, in an embodiment, one or more parameters of the effective medium approximation may be determined using a fiducial calibration method. So, an embodiment may enable better precision of a reconstructed parameter of interest.

Thus, in an embodiment, an effective medium theory is used to model the roughness of a SIL tip in, for example, an inspection apparatus. The model of the roughness may be part of a mathematical model describing the SIL and a measurement target to be measured using the SIL. In an embodiment, a high n or high κ refractive index material fiducial may be used to calibrate one or more parameters of the effective medium model. In an embodiment, one or more determined EMA parameters or measured fiducial data, or one or more parameters derived therefrom (e.g., one or more statistics), may be used in a machine learning or statistical technique to derive one or more new EMA parameters. For example, one or more prior determined EMA parameters or measured fiducial data, or one or more parameters derived therefrom (e.g., one or more statistics), may be used in a Bayesian regularization to derive new values of EMA parameters. In an embodiment, one or more determined EMA parameters or measured fiducial data may be evaluated to determine whether a threshold is crossed, whereupon a signal may be given as a diagnostic to, e.g., to warn of the desirability of, or cause, servicing or replacement of the SIL. In an embodiment, the signal triggers cleaning by, or controls one or more cleaning parameters of, a SIL cleaning unit. In an embodiment, the SIL cleaning unit is located in the inspection apparatus. In an embodiment, one or more determined EMA parameters or measured fiducial data may be used to predict if and/or when the one or more EMA parameters or measured fiducial data will cross a threshold and provide a signal thereof (e.g., a signal that servicing of the SIL is desired). In an embodiment, a reconstructed gap, using the fiducial, is used to calibrate one or more parameters of a calibration method using a proximity force or stiffness calculation.

So, in an embodiment, a modelling of the SIL tip roughness (surface roughness and/or waviness) may relax the design specifications of a SIL, which may allow for improved manufacturability of the SIL and/or result in lower manufacturing costs. In an embodiment, once calibrated, the SIL tip will have a higher accuracy. Since a hyper-NA tool is sensitive, a calibrated tip can enable measurement of small features and/or irregularities on the target surface. In an embodiment, use of the fiducial can enable improved predictability of tool servicing, and thus potentially reduce down time. In an embodiment, the use of the fiducial can able improved tool cleaning, and thus enables throughput loss due to unnecessary cleaning action. In an embodiment, calibration using the fiducial can enable improved gap control. In an embodiment, mismatch between different tools may be reduced by the calibrating each of the tools using the fiducial.

While the various embodiments herein primarily describe position control of a SIL relative to a substrate/target surface, the disclosed methods and apparatus may be used to control the position of any component, such as a microcantilever, relative to any surface. Further, while discussion herein has focused on a lithographic process, the techniques described herein may be used in or other manufacturing process (e.g., etching, resist developing, etc. processes).

As described above, in an embodiment, there are provided various techniques to control the gap by a technique based on one or more specific measurement signals. The techniques have particular applicability in an optical metrology or inspection apparatus such as a scatterometer, an alignment sensor (which determine alignment between alignment mark), an encoder or interferometer (which enable position measurement), and/or a height or level sensor (which enables measuring of the position of a surface). So, while the embodiments disclosed herein use optical metrology as an application of the disclosed technique, the technique can be applied in other applications of SILs, such as used to reconstruct a structure based on radiation captured by SILs, or in any other applications where an object is positioned and/or maintained very close to another object (e.g., in the below 400 nm range). The technique need not be applied exclusively, and could be applied in combination with one or more other techniques.

In an embodiment, there is provided a method involving a radiation intensity distribution for a target measured using an optical component at a gap from the target, the method comprising: determining a value of a parameter of interest using the measured radiation intensity distribution and a mathematical model describing the target, the model comprising an effective medium approximation for roughness of a surface of the optical component or a part thereof.

In an embodiment, the effective medium approximation (EMA) is one or more selected from: Bruggeman's EMA, Maxwell-Garnett Theory EMA, Drude EMA, Volume Averaging Theory EMA, Lorentz-Lorenz EMA, Parallel EMA and/or Series EMA. In an embodiment, the effective medium approximation comprises multiple effective approximations, each having a different real or complex refractive index, refractive index tensor and/or thickness, and/or comprises a gradient of refractive index as a function of distance. In an embodiment, the mathematical model is a unit cell model representing a period of a periodic structure of the target. In an embodiment, the method comprises calculating a radiation intensity distribution using the mathematical model and deriving the value of the parameter from comparison of the calculated radiation intensity distribution with the measured radiation intensity distribution. In an embodiment, the method further comprises illuminating, using the optical element, a surface of a fiducial with radiation; measuring the radiation using a detector; and using the measured radiation, determining one or more parameters of the effective medium approximation in the model. In an embodiment, the fiducial surface material has a refractive index with a real part nf and an imaginary part κf, wherein the surface material has (1) high nf and low κf or (2) low nf and high κf. In an embodiment, the method comprises a further mathematical model, the further mathematical model comprising the effective medium approximation for roughness of the surface of the optical element and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial. In an embodiment, the parameter of interest comprises a parameter of the target.

In an embodiment, there is provided a method involving a mathematical model describing a measurement target, the model comprising an effective medium approximation for roughness of a surface of an optical element used to measure the target, the method comprising: illuminating, using the optical element, a surface of a fiducial with radiation; measuring the radiation using a detector; and using the measured radiation, determining one or more parameters of the effective medium approximation in the model.

In an embodiment, the fiducial surface material has a refractive index with a real part nf and an imaginary part κf, wherein the surface material has (1) high nf and low κf or (2) low nf and high κf. In an embodiment, the fiducial surface comprises an essentially atomically flat surface to receive the radiation. In an embodiment, the fiducial surface comprises a surface with a roughness to receive the radiation. In an embodiment, the fiducial surface material comprises one or more selected from: Ag, GaP, Si, SiC, BP, Cu, $Ta_2O_5$ and/or Al. In an embodiment, wherein the fiducial surface comprises a crystal. In an embodiment, the crystal comprises a cleaved crystal. In an embodiment, wherein the crystal comprises mica. In an embodiment, the fiducial surface comprises a metal. In an embodiment, the fiducial surface material comprises a liquid metal. In an embodiment, the liquid metal comprises GaInSn or Hg. In an embodiment, the fiducial surface comprises a material with a layer on top. In an embodiment, the method comprises a plurality of layers on top of the material. In an embodiment, the layer comprises a metal. In an embodiment, the metal comprises Al, Cu, Ag and/or Au. In an embodiment, the layer comprises an oxide. In an embodiment, the oxide comprises native $SiO_2$ on Si, thermal $SiO_2$ on Si, native $Al_2O_3$ on Al, or epitaxial $Al_2O_3$ on NiAl(110). In an embodiment, the layer comprises a 2d nanomaterial. In an embodiment, the 2d material comprises single or multilayer graphene, hexagonal boron nitride, or a transition metal dichalcogenide nanolayer. In an embodiment, the method comprises a further mathematical model, the further mathematical model comprising the effective medium approximation for roughness of the surface of the optical element and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial. In an embodiment, the method comprises a further mathematical model, the further mathematical model comprising the effective medium approximation for roughness of the surface of the optical element and a further parameterized effective medium approximation for the roughness of the fiducial surface, and further comprising calculating radiation intensity distributions using the further mathematical model and deriving the value of the one or more parameters of the effective medium approximation for roughness of the surface of the optical element from comparison of the calculated radiation intensity distributions with the radiation intensity distribution measured using the fiducial. In an embodiment, the method further comprises repeating the illuminating and measuring to obtain a plurality of values of measured fiducial data and/or repeating the illuminating, measuring and determining to obtain a plurality of values of one or more parameters of the effective medium approximation. In an embodiment, the method further comprises using the plurality of values of one or more determined parameters of the effective medium approximation and/or one or more measured fiducial data, or one or more parameters derived therefrom, in a machine learning or statistical technique to derive one or more new values of one or more parameters of the effective medium approximation. In an embodiment, the technique comprises a Bayesian regularization. In an embodiment, the method further comprises evaluating one or more values of the plurality of values of the one or more determined parameters of the effective medium approximation or measured fiducial data, or of one or more parameters derived therefrom, to determine whether a threshold is crossed, whereupon a signal may be given as a diagnostic. In an embodiment, the signal instructs servicing or replacement of the optical component and/or the fiducial. In an embodiment, the method further comprises triggering, based upon the signal cleaning by, or controlling one or more cleaning parameters of, a cleaning unit of the optical component and/or the fiducial. In an embodiment, the cleaning unit is located in an inspection apparatus housing the optical component and/or the fiducial. In an embodiment, the method further comprises evaluating one or more values of the plurality of values of the one or more determined parameters of the effective medium approximation or measured fiducial data, or of one or more parameters derived therefrom, to predict if and/or when one or more determined parameters of the effective medium approximation or measured fiducial data, or of one or more parameters derived therefrom, will cross a threshold, whereupon a signal may be given as a diagnostic. In an embodiment, the signal instructs servicing or replacement of the optical component. In an embodiment, the method further comprises using the measured radiation to reconstruct the gap size and using the reconstructed gap size to calibrate one or more parameters of a calibration method using a proximity force or stiffness calculation.

In an embodiment, there is provided a method involving a radiation intensity distribution measured using an optical component at a gap from a surface, the method comprising: determining a roughness parameter of the optical component, a fiducial or a target using the measured radiation intensity distribution and a mathematical model describing the surface, the model comprising an effective medium approximation for roughness of a surface of an optical component or a part thereof.

In an embodiment, the effective medium approximation (EMA) is one or more selected from: Bruggeman's EMA, Maxwell-Garnett Theory EMA, Drude EMA, Volume Averaging Theory EMA, Lorentz-Lorenz EMA, Parallel EMA and/or Series EMA.

In an embodiment, there is provided a method of manufacturing devices wherein a device pattern is applied to a series of substrates using a lithographic process, the method including inspecting at least a target formed as part of or beside the device pattern on at least one of the substrates using a method as described herein, and controlling the lithographic process for later substrates in accordance with the result of the method.

In an embodiment, there is provided a non-transitory computer program product comprising machine-readable instructions for causing a processor to cause performance of a method herein.

In an embodiment, there is provided a system comprising: an inspection apparatus configured to provide a beam on a measurement target on a substrate and to detect radiation redirected by the target to determine a parameter of a lithographic process; and a non-transitory computer program product as described herein.

In an embodiment, the system further comprises a lithographic apparatus, the lithographic apparatus comprising a support structure configured to hold a patterning device to modulate a radiation beam and a projection optical system arranged to project the modulated onto a radiation-sensitive substrate.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

Further embodiments according to the invention are provided in below numbered clauses:

1. A method involving a radiation intensity distribution for a target measured using an optical component at a gap from the target, the method comprising:
    determining a value of a parameter of interest using the measured radiation intensity distribution and a mathematical model describing the target, the model comprising an effective medium approximation for roughness of a surface of the optical component or a part thereof.

2. The method of clause 1, wherein the effective medium approximation (EMA) is one or more selected from: Bruggeman's EMA, Maxwell-Garnett Theory EMA, Drude EMA, Volume Averaging Theory EMA, Lorentz-Lorenz EMA, Parallel EMA and/or Series EMA.

3. The method of clause 1 or clause 2, wherein the effective medium approximation comprises multiple effective approximations, each having a different real or complex refractive index, refractive index tensor and/or thickness, and/or comprises a gradient of refractive index as a function of distance.

4. The method of any of clauses 1-3, wherein the mathematical model is a unit cell model representing a period of a periodic structure of the target.

5. The method of any of clauses 1-4, comprising calculating a radiation intensity distribution using the mathematical model and deriving the value of the parameter from comparison of the calculated radiation intensity distribution with the measured radiation intensity distribution.

6. The method of any of clauses 1-5, further comprising:
    illuminating, using the optical element, a surface of a fiducial with radiation;
    measuring the radiation using a detector; and
    using the measured radiation, determining one or more parameters of the effective medium approximation in the model.

7. The method of clause 6, wherein the fiducial surface material has a refractive index with a real part nf and an imaginary part κf, wherein the surface material has (1) high nf and low κf or (2) low nf and high κf.

8. The method of clause 6 or clause 7, comprising a further mathematical model, the further mathematical model comprising the effective medium approximation for roughness of the surface of the optical element and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial.

9. The method of any of clauses 1-8, wherein the parameter of interest comprises a parameter of the target.

10. A method involving a mathematical model describing a measurement target, the model comprising an effective medium approximation for roughness of a surface of an optical element used to measure the target, the method comprising:
    illuminating, using the optical element, a surface of a fiducial with radiation;
    measuring the radiation using a detector; and
    using the measured radiation, determining one or more parameters of the effective medium approximation in the model.

11. The method of clause 10, wherein the fiducial surface material has a refractive index with a real part nf and an imaginary part κf, wherein the surface material has (1) high nf and low κf or (2) low nf and high κf.

12. The method of clause 10 or clause 11, wherein the fiducial surface comprises an essentially atomically flat surface to receive the radiation.

13. The method of any of clauses 10-12, wherein the fiducial surface comprises a surface with a roughness to receive the radiation.

14. The method of any of clauses 10-13, wherein the fiducial surface material comprises one or more selected from: Ag, GaP, Si, SiC, BP, Cu, $Ta_2O_5$ and/or Al.

15. The method of any of clauses 10-14, wherein the fiducial surface comprises a crystal.

16. The method of clause 15, wherein the crystal comprises a cleaved crystal.

17. The method of clause 15 or clause 16, wherein the crystal comprises mica.

18. The method of any of clauses 10-17, wherein the fiducial surface comprises a metal.

19. The method of any of clauses 10-18, wherein the fiducial surface material comprises a liquid metal.

20. The method of clause 19, wherein the liquid metal comprises GaInSn or Hg.

21. The method of any of clauses 10-20, wherein the fiducial surface comprises a material with a layer on top.

22. The method of clause 21, comprising a plurality of layers on top of the material.

23. The method of clause 21 or clause 22, wherein the layer comprises a metal.

24. The method of clause 23, wherein the metal comprises Al, Cu, Ag and/or Au.

25. The method of any of clauses 21-24, wherein the layer comprises an oxide.

26. The method of clause 25, wherein the oxide comprises native $SiO_2$ on Si, thermal $SiO_2$ on Si, native $Al_2O_3$ on Al, or epitaxial $Al_2O_3$ on NiAl(110).

27. The method of any of clauses 21-26, wherein the layer comprises a 2d nanomaterial.

28. The method of clause 27, wherein the 2d material comprises single or multilayer graphene, hexagonal boron nitride, or a transition metal dichalcogenide nanolayer.

29. The method of any of clauses 10-28, comprising a further mathematical model, the further mathematical model comprising the effective medium approximation for roughness of the surface of the optical element and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial.

30. The method of any of clauses 10-29, comprising a further mathematical model, the further mathematical model comprising the effective medium approximation for roughness of the surface of the optical element and a further parameterized effective medium approximation for the roughness of the fiducial surface, and further comprising calculating radiation intensity distributions using the further mathematical model and deriving the value of the one or more parameters of the effective medium approximation for roughness of the surface of the optical element from comparison of the calculated radiation intensity distributions with the radiation intensity distribution measured using the fiducial.

31. The method of any of clauses 10-30, further comprising repeating the illuminating and measuring to obtain a plurality of values of measured fiducial data and/or repeating the illuminating, measuring and determining to obtain a plurality of values of one or more parameters of the effective medium approximation.

32. The method of clause 31, further comprising using the plurality of values of one or more determined parameters of the effective medium approximation and/or one or more measured fiducial data, or one or more parameters derived therefrom, in a machine learning or statistical technique to derive one or more new values of one or more parameters of the effective medium approximation.

33. The method of clause 32, wherein the technique comprises a Bayesian regularization.

34. The method of any of clauses 31-33, further comprising evaluating one or more values of the plurality of values of the one or more determined parameters of the effective medium approximation or measured fiducial data, or of one or more parameters derived therefrom, to determine whether a threshold is crossed, whereupon a signal may be given as a diagnostic.

35. The method of clause 34, wherein the signal instructs servicing or replacement of the optical component and/or the fiducial.

36. The method of clause 34 or clause 35, further comprising triggering, based upon the signal cleaning by, or controlling one or more cleaning parameters of, a cleaning unit of the optical component and/or the fiducial.

37. The method of clause 36, wherein the cleaning unit is located in an inspection apparatus housing the optical component and/or the fiducial.

38. The method of clauses 31-37, further comprising evaluating one or more values of the plurality of values of the one or more determined parameters of the effective medium approximation or measured fiducial data, or of one or more parameters derived therefrom, to predict if and/or when one or more determined parameters of the effective medium approximation or measured fiducial data, or of one or more parameters derived therefrom, will cross a threshold, whereupon a signal may be given as a diagnostic.

39. The method of clause 38, wherein the signal instructs servicing or replacement of the optical component.

40. The method of any of clauses 10-39, further comprising using the measured radiation to reconstruct the gap size and using the reconstructed gap size to calibrate one or more parameters of a calibration method using a proximity force or stiffness calculation.

41. A method involving a radiation intensity distribution measured using an optical component at a gap from a surface, the method comprising:
determining a roughness parameter of the optical component, a fiducial or a target using the measured radiation intensity distribution and a mathematical model describing the surface, the model comprising an effective medium approximation for roughness of a surface of an optical component or a part thereof.

42. The method of clause 41, wherein the effective medium approximation (EMA) is one or more selected from: Bruggeman's EMA, Maxwell-Garnett Theory EMA, Drude EMA, Volume Averaging Theory EMA, Lorentz-Lorenz EMA, Parallel EMA and/or Series EMA.

43. A method of manufacturing devices wherein a device pattern is applied to a series of substrates using a lithographic process, the method including inspecting at least a target formed as part of or beside the device pattern on at least one of the substrates using the method of any of clauses 1-42, and controlling the lithographic process for later substrates in accordance with the result of the method.

44. A non-transitory computer program product comprising machine-readable instructions for causing a processor to cause performance of the method of any of clauses 1-43.

45. A system comprising:
an inspection apparatus configured to provide a beam on a measurement target on a substrate and to detect radiation redirected by the target to determine a parameter of a lithographic process; and
the non-transitory computer program product of clause 44.

46. The system of clause 45, further comprising a lithographic apparatus, the lithographic apparatus comprising a support structure configured to hold a patterning device to modulate a radiation beam and a projection optical system arranged to project the modulated onto a radiation-sensitive substrate.

Although specific reference may have been made above to the use of embodiments of the invention in the context of optical lithography, it will be appreciated that the invention may be used in other applications, for example imprint lithography, and where the context allows, is not limited to optical lithography. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method comprising:
obtaining a measured radiation intensity distribution for a target measured using an optical component at a gap from the target; and
determining a value of a parameter of interest using the measured radiation intensity distribution and a mathematical model describing the target, the model comprising an effective medium approximation for roughness of a surface of the optical component or a part thereof.

2. The method of claim 1, wherein the effective medium approximation (EMA) is one or more selected from: Bruggeman's EMA, Maxwell-Garnett Theory EMA, Drude EMA, Volume Averaging Theory EMA, Lorentz-Lorenz EMA, Parallel EMA and/or Series EMA.

3. The method of claim 1, wherein the effective medium approximation comprises multiple effective approximations, each having a different real or complex refractive index, refractive index tensor and/or thickness, and/or comprises a gradient of refractive index as a function of distance.

4. The method of claim 1, wherein the mathematical model is a unit cell model representing a period of a periodic structure of the target.

5. The method of claim 1, comprising calculating a radiation intensity distribution using the mathematical model and deriving the value of the parameter from comparison of the calculated radiation intensity distribution with the measured radiation intensity distribution.

6. The method of claim 1, further comprising:
illuminating, using the optical component, a surface of a fiducial with radiation;
measuring the radiation using a detector; and
using the measured radiation, determining one or more parameters of the effective medium approximation in the model.

7. The method of claim 6, comprising a further mathematical model, the further mathematical model comprising the effective medium approximation for roughness of the surface of the optical component and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial.

8. A method of manufacturing devices wherein a device pattern is applied to a series of substrates using a lithographic process, the method including inspecting at least a target formed as part of or beside the device pattern on at least one of the substrates using the method of claim 1, and controlling the lithographic process for later substrates in accordance with the result of the method.

9. The method of claim 1, wherein the parameter of interest comprises a parameter of the target.

10. A method comprising:
illuminating, using an optical element, a surface of a fiducial with radiation;
measuring the radiation using a detector; and
using the measured radiation, determining one or more parameters of an effective medium approximation in a mathematical model, the effective medium approximation approximating for roughness of a surface of the optical element used to measure a physical measurement target,
where the model, when used in combination with a measured radiation intensity distribution obtained from illuminating the physical measurement target with radiation from the optical element, is configured to determine a parameter of interest relating to the physical measurement target.

11. The method of claim 10, comprising a further mathematical model, the further mathematical model comprising the effective medium approximation for roughness of the surface of the optical element and a representation, with known parameters, of the fiducial surface, and further comprising calculating a radiation intensity distribution using the further mathematical model and deriving the value of the one or more parameters of the effective medium approximation from comparison of the calculated radiation intensity distribution with the radiation intensity distribution measured using the fiducial.

12. The method of claim 10, comprising a further mathematical model, the further mathematical model comprising the effective medium approximation for roughness of the surface of the optical element and a further parameterized effective medium approximation for the roughness of the fiducial surface, and further comprising calculating a radiation intensity distribution using the further mathematical model and deriving the value of the one or more parameters of the effective medium approximation for roughness of the surface of the optical element from comparison of the calculated radiation intensity distribution with the radiation intensity distribution measured using the fiducial.

13. The method of claim 10, further comprising repeating the illuminating and measuring to obtain a plurality of values of measured fiducial data and/or repeating the illuminating, measuring and determining to obtain a plurality of values of one or more parameters of the effective medium approximation.

14. The method of claim 13, further comprising using the plurality of values of one or more determined parameters of the effective medium approximation and/or one or more measured fiducial data, or one or more parameters derived therefrom, in a machine learning or statistical technique to derive one or more new values of one or more parameters of the effective medium approximation.

15. The method of claim 13, further comprising evaluating one or more values of the plurality of values of the one or more determined parameters of the effective medium approximation or measured fiducial data, or of one or more parameters derived therefrom, to determine whether a threshold is crossed.

16. The method of claim 13, further comprising evaluating one or more values of the plurality of values of the one or more determined parameters of the effective medium approximation or measured fiducial data, or of one or more parameters derived therefrom, to predict if and/or when one or more determined parameters of the effective medium approximation or measured fiducial data, or of one or more parameters derived therefrom, will cross a threshold.

17. The method of claim 10, further comprising using the measured radiation to reconstruct a gap size in relation to the optical element and using the reconstructed gap size to calibrate one or more parameters of a calibration method using a proximity force or stiffness calculation.

18. A non-transitory computer program product comprising machine-readable instructions, when executed by a computer system, configured to cause the computer system to at least:
   obtain a measured radiation intensity distribution for a target measured using an optical component at a gap from the target; and
   determine a value of a parameter of interest using the measured radiation intensity distribution and a mathematical model describing the target, the model comprising an effective medium approximation for roughness of a surface of the optical component or a part thereof.

19. A system comprising:
   an inspection apparatus configured to provide a beam on a measurement target on a substrate and to detect radiation redirected by the target to determine a parameter of a lithographic process; and
   the non-transitory computer program product of claim 18.

20. The system of claim 19, further comprising a lithographic apparatus, the lithographic apparatus comprising a support structure configured to hold a patterning device to modulate a radiation beam and a projection optical system arranged to project the modulated radiation beam onto a radiation-sensitive substrate.

* * * * *